(12) United States Patent
Okamoto et al.

(10) Patent No.: US 11,380,474 B2
(45) Date of Patent: Jul. 5, 2022

(54) ELECTRONIC DEVICE

(71) Applicant: Murata Manufacturing Co., Ltd., Nagaokakyo (JP)

(72) Inventors: Bunta Okamoto, Nagaokakyo (JP); Kuniaki Yosui, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 888 days.

(21) Appl. No.: 16/205,265

(22) Filed: Nov. 30, 2018

(65) Prior Publication Data
US 2019/0103213 A1 Apr. 4, 2019

Related U.S. Application Data

(63) Continuation of application No. PCT/JP2017/024285, filed on Jul. 3, 2017.

(30) Foreign Application Priority Data

Jul. 6, 2016 (JP) .............................. JP2016-134155
Feb. 3, 2017 (JP) .............................. JP2017-018064

(51) Int. Cl.
*H05K 1/16* (2006.01)
*H01F 27/28* (2006.01)
(Continued)

(52) U.S. Cl.
CPC ..... *H01F 27/2804* (2013.01); *H01F 17/0013* (2013.01); *H01F 27/32* (2013.01);
(Continued)

(58) Field of Classification Search
CPC ............... H01F 17/00; H01F 2017/006; H01F 27/2804; H01F 27/32; H05K 1/165;
(Continued)

(56) References Cited

U.S. PATENT DOCUMENTS 7,064,645 B2 * 6/2006 Kobayashi .......... H01F 17/0006
336/200
7,746,232 B2 * 6/2010 Hashimoto ............ H01Q 21/28
336/200

(Continued)

FOREIGN PATENT DOCUMENTS

| JP | 03-89548 A | 4/1991 |
| WO | 2014/129278 A1 | 8/2014 |
| WO | 2014/129279 A1 | 8/2014 |

OTHER PUBLICATIONS

Official Communication issued in International Patent Application No. PCT/JP2017/024285, dated Sep. 12, 2017.

*Primary Examiner* — Hoa C Nguyen
(74) *Attorney, Agent, or Firm* — Keating & Bennett, LLP

(57) ABSTRACT

An electronic device includes an inductor bridge that connects first and second circuits. The inductor bridge includes an insulating base material and a conical coil in the insulating base material. The conical coil includes loop shaped conductors arranged in a winding axis direction. Inner and outer diameters of the loop shaped conductors change is one way in the winding axis direction. A large-diameter loop shaped conductor, which is one of the loop shaped conductors that has the largest inner and outer diameters, is disposed such that the inner and outer diameters thereof relatively extend along the insulating base material compared with the other loop shaped conductors when the inductor bridge is bent.

20 Claims, 18 Drawing Sheets

(51) Int. Cl.
  *H05K 3/46*  (2006.01)
  *H05K 1/02*  (2006.01)
  *H01F 17/00* (2006.01)
  *H01F 27/32* (2006.01)
  *H05K 1/11*  (2006.01)
  *H05K 1/14*  (2006.01)

(52) U.S. Cl.
  CPC .............. *H05K 1/02* (2013.01); *H05K 1/028* (2013.01); *H05K 1/111* (2013.01); *H05K 1/144* (2013.01); *H05K 1/147* (2013.01); *H05K 1/16* (2013.01); *H05K 1/165* (2013.01); *H05K 3/46* (2013.01); *H01F 2027/2809* (2013.01); *H05K 2201/042* (2013.01)

(58) Field of Classification Search
  CPC ...... H05K 1/0233; H05K 1/111; H05K 1/144; H05K 1/147; H05K 2201/042
  See application file for complete search history.

(56) References Cited

U.S. PATENT DOCUMENTS

| | | | |
|---|---|---|---|
| 9,159,485 B2* | 10/2015 | Weatherspoon | H01F 17/0006 |
| 9,324,491 B2* | 4/2016 | Yosui | H01F 5/00 |
| 10,304,623 B2* | 5/2019 | Song | H01L 23/49822 |
| 10,455,687 B2* | 10/2019 | Cho | H05K 1/181 |
| 2006/0139124 A1* | 6/2006 | Fojas | H01P 5/02 333/185 |
| 2007/0164843 A1* | 7/2007 | Yagisawa | H01Q 19/09 336/83 |
| 2008/0042785 A1* | 2/2008 | Yagisawa | H01P 1/2007 333/245 |
| 2014/0292462 A1* | 10/2014 | Lee | H01F 41/04 29/602.1 |
| 2015/0068299 A1* | 3/2015 | Zhu | G01F 1/6845 29/846 |
| 2015/0294781 A1 | 10/2015 | Yosui et al. | |
| 2015/0340151 A1 | 11/2015 | Yosui et al. | |

* cited by examiner

ELECTRONIC DEVICE

CROSS REFERENCE TO RELATED APPLICATIONS

This application claims the benefit of priority to Japanese Patent Application No. 2016-134155 filed on Jul. 6, 2016 and Japanese Patent Application No. 2017-018064 filed on Feb. 3, 2017, and is a Continuation Application of PCT Application No. PCT/JP2017/024285 filed on Jul. 3, 2017. The entire contents of each application are hereby incorporated herein by reference.

BACKGROUND OF THE INVENTION

1. Field of the Invention

The present invention relates to an electronic device, and, in particular, to an electronic device that includes an inductor bridge including an inductance component.

2. Description of the Related Art

To date, in a case in which a small electronic device, such as a mobile terminal, includes a plurality of mounted circuit members, such as circuit boards, the mounted circuit members are connected to each other via a flat cable having flexibility as described, for example, in International Publication No. 2014/129279.

FIG. 18 is an exploded perspective view of an inductor bridge 100 described in International Publication No. 2014/129279. The inductor bridge 100 includes an insulating base material (a multilayer body of base material layers 11a, 12a, 13a, and 14a) having flexibility and a helical coil (a helical shaped coil including loop shaped conductors 31a, 32a, 33a, and 34a) in contact with the insulating base material.

When a flexible inductor bridge disclosed in International Publication No. 2014/129279, is disposed in a limited space in an electronic device, the inductor bridge may be disposed in a state in which a predetermined portion thereof is bent. However, when the inductor bridge is bent, the shape of the helical coil is deformed with deformation of the insulating base material, and the interline capacitance (interlayer capacitance) of the helical coil may change. Thus, the electric characteristics of the helical coil may change between before and after bending of the inductor bridge.

SUMMARY OF THE INVENTION

Preferred embodiments of the present invention provide electronic devices each including an inductor bridge with which variation in electric characteristics due to bending is reduced or prevented.

An electronic device according to a preferred embodiment of the present invention includes an inductor bridge, a first circuit, and a second circuit. The first circuit and the second circuit are connected to each other via the inductor bridge. The inductor bridge includes an insulating base material that includes a first main surface and that has flexibility, and a conical coil that is in contact with the insulating base material and includes a winding axis perpendicular or substantially perpendicular to the first main surface. The conical coil includes a plurality of loop shaped conductors that are arranged in a winding axis direction of the conical coil. Inner and outer diameters of the plurality of loop shaped conductors change in one way in the winding axis direction. The plurality of loop shaped conductors do not overlap each other as viewed in the winding axis direction. A large-diameter loop shaped conductor having the largest inner and outer diameters among the plurality of loop shaped conductors is disposed at a position such that the inner and outer diameters thereof relatively extend along the insulating base material compared with the other loop shaped conductors when the inductor bridge is bent.

With this structure, because the large-diameter loop shaped conductor is disposed at a position such that the inner and outer diameters thereof relatively extend along the insulating base material compared with the other loop shaped conductors when the inductor bridge is bent, the large-diameter loop shaped conductor and the other loop shaped conductors do not oppose each other face to face. Therefore, even when the inductor bridge is bent, changes in interlayer capacitance between the plurality of loop shaped conductors are reduced or prevented, and variation in electric characteristics of the conical coil due to bending of the inductor bridge is reduced or prevented.

In an electronic device according to a preferred embodiment of the present invention, preferably, the insulating base material is a multilayer body that includes a plurality of base material layers made of a thermoplastic resin that are stacked. With this structure, because the insulating base material is a thermoplastic resin, the shape of the insulating base material is able to be easily plastically deformed in accordance with the mounting state (such as protrusions and recesses of an object on which the inductor bridge is to be mounted).

In an electronic device according to a preferred embodiment of the present invention, the inductor bridge may include a bent portion in a portion thereof.

In an electronic device according to a preferred embodiment of the present invention, preferably, the conical coil is wound to include more than 2 turns, and, as viewed in the winding axis direction, when a portion of the conical coil that is wound at an outermost periphery is defined as a first coil portion, a portion of the conical coil that is located at an (n−1)-th from the first coil portion toward an inner periphery is defined as an n-th coil portion, n being an integer larger than or equal to 2, a gap between the first coil portion and a second coil portion is defined as a first gap, and a gap between the n-th coil portion and an (n+1)-th coil portion is defined as an n-th gap, the first gap is larger than any other gaps. A portion at which the first coil portion and the second coil portion extend in parallel or substantially in parallel to each other is longer than a portion at which the other coil portions extend in parallel or substantially in parallel to each other. Therefore, with this structure, compared with a case in which the sizes of the other gaps are increased, the interline capacitance of the conical coil is able to be effectively reduced, and the self-resonance frequency of the conical coil is able to be increased.

Moreover, with this structure, compared with a case in which all of the gaps are equally increased, an increase in size of the conical coil is able to be reduced or prevented, while effectively reducing the interline capacitance of the conical coil.

In an electronic device according to a preferred embodiment of the present invention, preferably, the n-th gap is larger than an (n+1)-th gap. A portion at which the n-th coil portion and the (n+1)-th coil portion extend in parallel or substantially in parallel to each other is longer than a portion at which the (n+1)-th coil portion and the (n+2)-th coil portion extend in parallel or substantially in parallel to each other. Therefore, by increasing the size of the n-th gap, compared with a case in which the size of the (n+1)-th gap is increased, the interline capacitance of the conical coil is able to be effectively reduced, and the self-resonance frequency of the conical coil is able to be increased.

In an electronic device according to a preferred embodiment of the present invention, the first gap as viewed in the winding axis direction may be larger than any of the other gaps as viewed in the winding axis direction.

In an electronic device according to a preferred embodiment of the present invention, the n-th gap as viewed in the winding axis direction may be larger than an (n+1)-th gap as viewed in the winding axis direction.

In an electronic device according to a preferred embodiment of the present invention, the first gap in the winding axis direction may be larger than any of the other gaps in the winding axis direction.

In an electronic device according to a preferred embodiment of the present invention, the n-th gap in the winding axis direction may be larger than an (n+1)-th gap in the winding axis direction.

In an electronic device according to a preferred embodiment of the present invention, preferably, a line width of the first coil portion is smaller than a line width of any of the other coil portions. A portion at which the first coil portion and the second coil portion extend in parallel or substantially in parallel to each other is longer than a portion at which the other coil portions extend in parallel or substantially in parallel to each other. Therefore, with this structure, the area in which the first coil portion and the second coil portion face each other is reduced, and thus, compared with a case in which the line widths of the other coil portions are reduced (that is, the area in which the other coil portions face each other is reduced), the interline capacitance of the conical coil is able to be effectively reduced, and the self-resonance frequency of the conical coil is able to be increased.

In an electronic device according to a preferred embodiment of the present invention, preferably, a line width of the n-th coil portion is smaller than a line width of the (n+1)-th coil portion. A portion at which the n-th coil portion and the (n+1)-th coil portion extend in parallel or substantially in parallel to each other is longer than a portion where the (n+1)-th coil portion and the (n+2)-th coil portion extend in parallel or substantially in parallel to each other. Therefore, with this structure, compared with a case in which the line width of the (n+1)-th coil portion is reduced, the interline capacitance of the conical coil is able to be effectively reduced, and the self-resonance frequency of the conical coil is able to be increased.

With preferred embodiments of the present invention, it is possible to provide electronic devices each including an inductor bridge with which variation in electric characteristics due to bending are reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
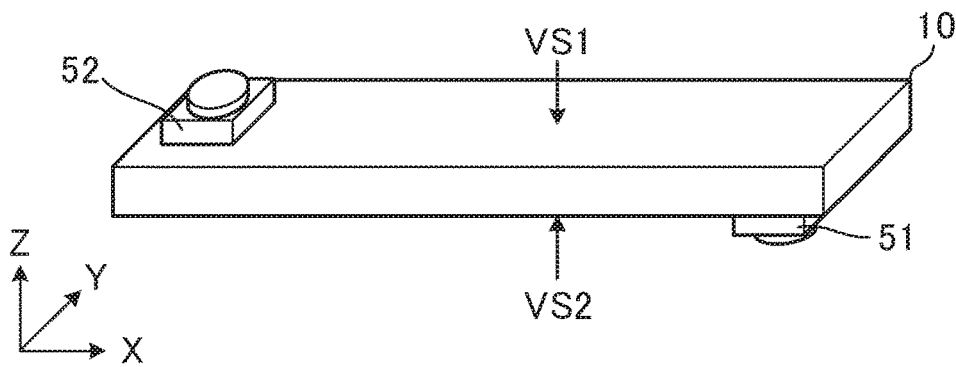
FIG. 1A is a perspective view of an inductor bridge 101 according to a first preferred embodiment of the present invention.

Hereinafter, a plurality of preferred embodiments of the present invention will be described with reference to the drawings and several specific examples. In the drawings, the same components and elements are denoted by the same reference signs. While preferred embodiments are divided and described for the sake of convenience simplify the description or understanding of the main points, elements described in different preferred embodiments are able to be partially replaced and combined with each other. In preferred embodiments, a description of features common to the first preferred embodiment will be omitted, and different features are primarily described. In particular, a description of similar advantageous operational effects achieved by similar structures will not be repeated in each preferred embodiment.

First Preferred Embodiment

Figure 1B:
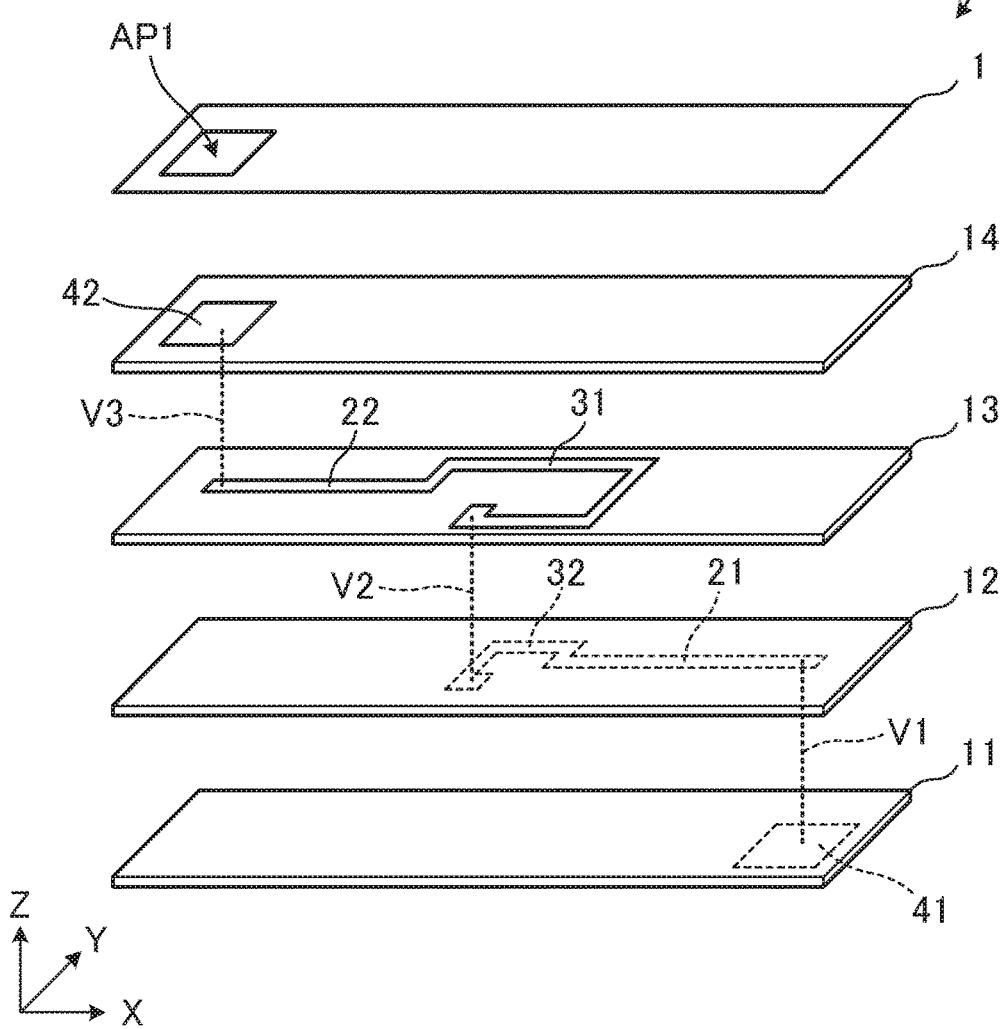
FIG. 1B is an exploded perspective view of the inductor bridge 101.
Figure 2A:
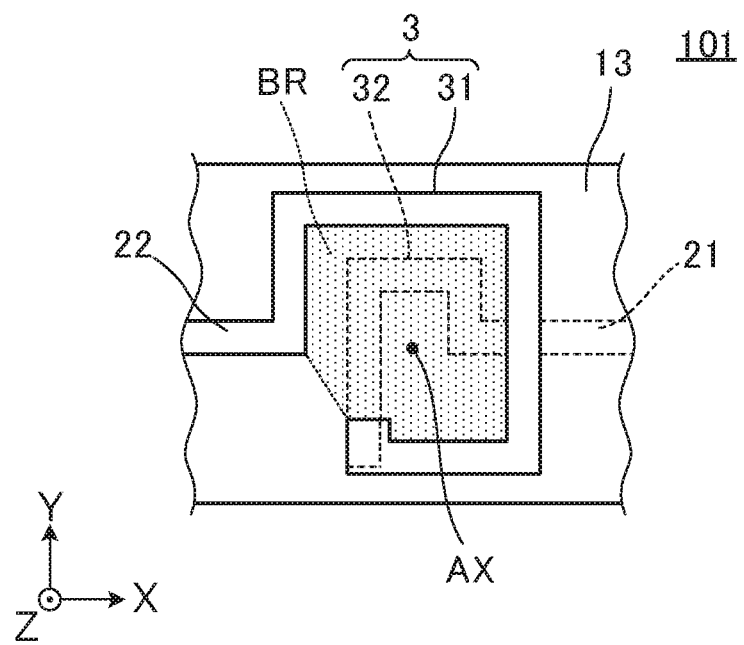
FIG. 2A is a plan view of a portion of the inductor bridge 101 in which a conical coil 3 is provided.
Figure 2B:
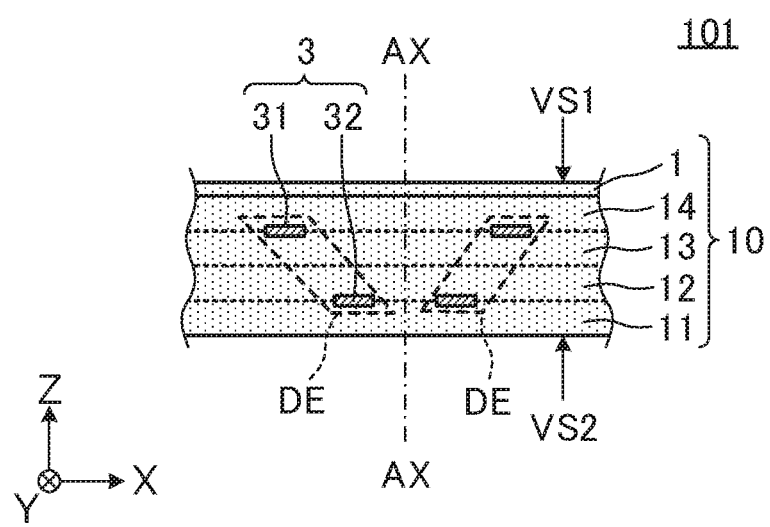
FIG. 2B is a sectional view of the portion.

FIG. 1A is a perspective view of an inductor bridge 101 according to a first preferred embodiment of the present invention, and FIG. 1B is an exploded perspective view of the inductor bridge 101. FIG. 2A is a plan view of a portion of the inductor bridge 101 in which a conical coil 3 is provided, and FIG. 2B is a sectional view of the portion. In FIG. 2A, for ease of understanding the structure, a protective layer 1 and a base material layer 14 are not illustrated. In FIG. 2A, an opening BR surrounded by a large-diameter loop shaped conductor 31 is shown by a dotted pattern.

The inductor bridge 101 includes an insulating base material 10, a conical coil 3 (described below in detail) provided in contact with the insulating base material 10, and connectors 51 and 52.

The insulating base material 10 includes a first main surface VS1 and a second main surface VS2 facing the first main surface VS1. The insulating base material 10 is preferable, for example a flat thermoplastic-resin plate having a rectangular or substantially rectangular parallelepiped shape whose longitudinal direction coincides with the X-axis direction.

The insulating base material 10 is a multilayer body including base material layers 11, 12, 13, and 14, and a protective layer 1 that are stacked; and has flexibility. The plurality of base material layers 11, 12, 13, and 14 are each a flat sheet that preferably have a rectangular or substantially rectangular planar shape whose longitudinal direction coincides with the X-axis direction and that is made of a thermoplastic resin, such as liquid crystal polymer, for example, as a main material.

An electrode 41 is provided on the back surface of the base material layer 11. The electrode 41 is a conductor pattern that is disposed near a first end (the right end of the base material layer 11 in FIG. 1B) of the base material layer 11 and that has a rectangular or substantially rectangular planar shape. The electrode 41 is preferably, for example, a conductor pattern made of a material, such as a Cu foil or other suitable material.

A small-diameter loop shaped conductor 32 and a conductor 21 are provided on the back surface of the base material layer 12. The small-diameter loop shaped conductor 32 is a rectangular or substantially rectangular loop shaped conductor pattern preferably having about 0.7 turns, for example, and being disposed near the center of the base material layer 12. The conductor 21 is a linear conductor pattern that extends in the X-axis direction, and is disposed between a first end of the base material layer 12 and the center of the base material layer 12. The small-diameter loop shaped conductor 32 and the conductor 21 are continuously provided, and a first end of the small-diameter loop shaped conductor 32 is connected to a first end of the conductor 21. A second end of the conductor 21 is connected to the electrode 41 via an interlayer connection conductor V1 provided in the base material layer 11. The small-diameter loop shaped conductor 32 and the conductor 21 are each preferably, for example, a conductor pattern made of a material such as a Cu foil or other suitable material. The interlayer connection conductor V1 is preferably, for example, a via conductor, a through-hole of which the inner wall is plated, or other suitable conductor.

The large-diameter loop shaped conductor 31 and a conductor 22 are provided on the front surface of the base material layer 13. The large-diameter loop shaped conductor 31 is a rectangular or substantially rectangular loop shaped conductor pattern preferably having about 0.8 turns, for example, and being provided near the center of the base material layer 13. As illustrated in FIG. 2A, the inner and outer diameters of the large-diameter loop shaped conductor 31 are larger than those of the small-diameter loop shaped conductor 32. The conductor 22 is a linear conductor pattern that extends in the X-axis direction, and is disposed between a second end (the left end of the base material layer 13 in FIG. 1B) of the base material layer 13 and the center of the base material layer 13. A first end of the large-diameter loop shaped conductor 31 is connected to the small-diameter loop shaped conductor 32 via an interlayer connection conductor V2 provided in the base material layers 12 and 13. The large-diameter loop shaped conductor 31 and the conductor 22 are continuously provided, and a second end of the large-diameter loop shaped conductor 31 is connected to a first end of the conductor 22. The large-diameter loop shaped conductor 31 and the conductor 22 are each preferably, for example, a conductor pattern made of a material such as a Cu foil or other suitable material. The interlayer connection conductor V2 is preferably, for example, a via conductor, a through-hole of which the inner wall is plated, or other suitable conductor.

The term "large-diameter loop shaped conductor" refers to one of a plurality of loop shaped conductors of a conical coil, the one having the largest inner and outer diameters (inner diameter and outer diameter).

An electrode 42 is provided on the front surface of the base material layer 14. The electrode 42 is a conductor pattern that is disposed near a second end (the left end of the base material layer 11 in FIG. 1B) of the base material layer 14 and that has a rectangular or substantially rectangular planar shape. The electrode 42 is connected to a second end of the conductor 22 via an interlayer connection conductor V3 provided in the base material layer 14. The electrode 42 is preferably, for example, a conductor pattern made of a material such as a Cu foil or other suitable material. The interlayer connection conductor V3 is preferably, for example, a via conductor, a through-hole of which the inner wall is plated, or other suitable conductor.

The protective layer 1 has the same or substantially the same planar shape as the base material layer 14 and is disposed on the front surface of the base material layer 14. The protective layer 1 includes an opening AP1 corresponding to the position of the electrode 42. Therefore, even when the protective layer 1 is disposed on the front surface of the base material layer 14, the electrode 42 is exposed on the first main surface VS1 of the insulating base material 10. The protective layer 1 is preferably, for example, a solder resist film. The protective layer 1 may be omitted.

The connector 51 is provided on the second main surface VS2 of the insulating base material 10 and is disposed near a first end (the right end of the insulating base material 10 in FIG. 1A) of the insulating base material 10 in the longitudinal direction. The connector 51 is connected to the electrode 41. The connector 52 is provided on the first main surface VS1 of the insulating base material 10 and is disposed near a second end (the left end of the insulating base material 10) of the insulating base material 10 in the longitudinal direction. The connector 52 is connected to the electrode 42.

In the inductor bridge 101, the rectangular or substantially rectangular conical coil 3 preferably including about 1.5 turns, for example, includes the small-diameter loop shaped conductor 32, the large-diameter loop shaped conductor 31, and the interlayer connection conductor V2, which are in contact with the plurality of base material layers 12 and 13. As illustrated in FIG. 2B, the conical coil 3 has a winding axis AX that is perpendicular or substantially perpendicular to the first main surface VS1 and the second main surface VS2 (parallel or substantially parallel to the Z-axis direction).

As illustrated in FIG. 2B, a plurality of loop shaped conductors (the small-diameter loop shaped conductor 32 and the large-diameter loop shaped conductor 31) are arranged in the direction (the Z-axis direction) of the winding axis AX of the conical coil 3. As illustrated in FIG. 2B, the large-diameter loop shaped conductor 31, which is one of the plurality of loop shaped conductors having the largest inner and outer diameters, is disposed closer to the first main surface VS1 than the other loop shaped conductor (the small-diameter loop shaped conductor 32) in the direction (Z-axis direction) of the winding axis AX of the conical coil 3.

Inner and outer diameters of the plurality of loop shaped conductors change in one way in the Z-axis direction (see the outline DE of the conical coil 3 in FIG. 2B). The phrase "change in one way in the winding axis direction" means that the inner and outer diameters of a plurality of loop shaped conductors change such that the inner and outer diameters increase (or decrease) in the Z-axis direction.

More specifically, the large-diameter loop shaped conductor 31 is disposed closer to the first main surface VS1 than the other loop shaped conductor (the small-diameter loop shaped conductor 32) in the Z-axis direction, and the small-diameter loop shaped conductor 32, which is one of the plurality of loop shaped conductors that has the smallest inner and outer diameters, is disposed farther from the first main surface VS1 than the other loop shaped conductor (the large-diameter loop shaped conductor 31) in the Z-axis direction. That is, as shown by the outline DE of the conical coil 3 in FIG. 2B, the inner and outer diameters of the plurality of loop shaped conductors change such that the inner and outer diameters increase in the +Z direction (from the second main surface VS2 side toward the first main surface VS1 side).

As illustrated in FIG. 2A, as viewed in the Z-axis direction, the small-diameter loop shaped conductor 32 is disposed inside of the opening BR surrounded by the large-diameter loop shaped conductor 31. The plurality of loop shaped conductors (the large-diameter loop shaped conductor 31 and the small-diameter loop shaped conductor 32) do not overlap each other as viewed in the Z-axis direction.

The phrase "a plurality of loop shaped conductors do not overlap each other as viewed in the winding axis direction" means that the plurality of loop shaped conductors, excluding portions thereof that are connected via an interlayer connection conductor, do not overlap each other (do not intersect) as viewed in the Z-axis direction.

Figure 3A:
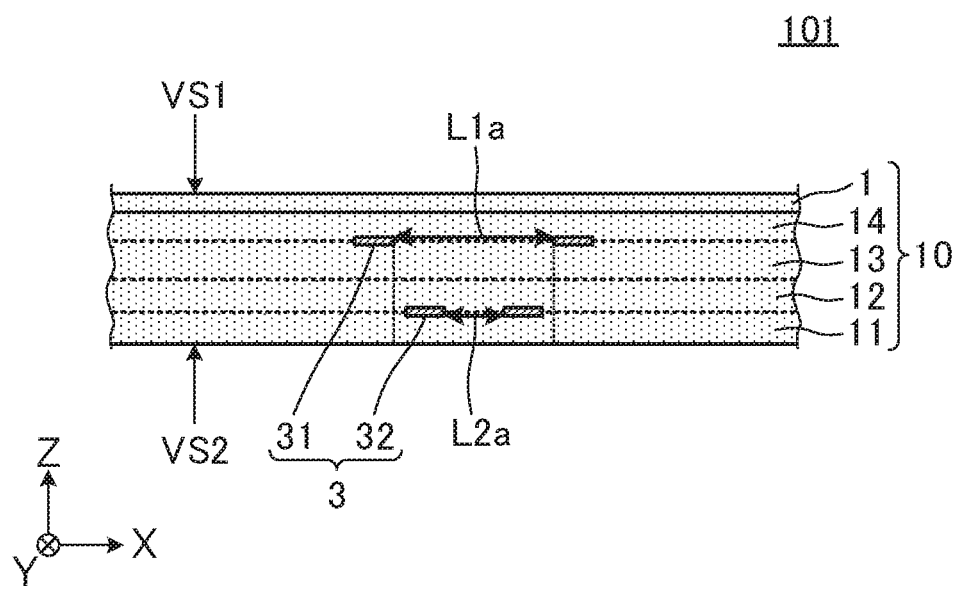
FIG. 3A is a partial sectional view of the inductor bridge 101 before being bent.

Next, a case in which an external force that bends the inductor bridge 101 is applied to the inductor bridge 101 will be described with reference to the drawings. FIG. 3A is a partial sectional view of the inductor bridge 101 before being bent, and FIG. 3B is a partial sectional view of the inductor bridge 101 after having been bent.

Figure 3B:
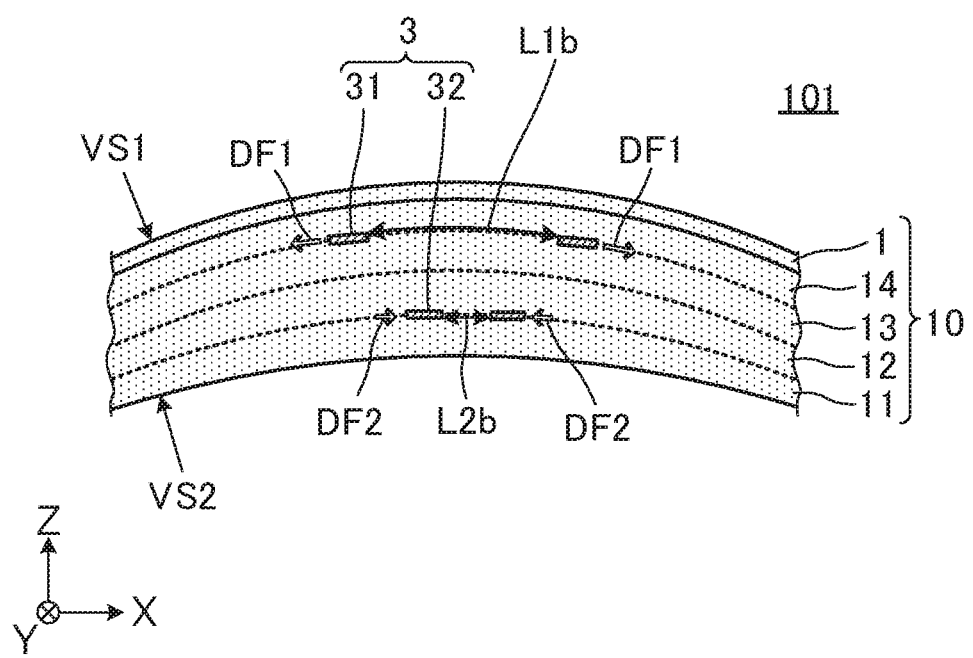
FIG. 3B is a partial sectional view of the inductor bridge 101 after having been bent.

As illustrated in FIG. 3B, the inductor bridge 101 is bent into an L-shape (such that the second main surface VS2 is on the inner side) along the longitudinal direction (X-axis direction) of the insulating base material 10. At this time, due to flexural displacement of the insulating base material 10, the first main surface VS1 side is deformed so as to be tensioned, and the second main surface VS2 side is deformed so as to be compressed. In accordance with the tensile deformation of the first main surface VS1 side, the large-diameter loop shaped conductor 31, which is located adjacent to the first main surface VS1 in the Z-axis direction, is displaced so as to extend toward both ends of the insulating base material 10 in the longitudinal direction (see the blank arrows DF1 in FIG. 3B). In accordance with the compressive deformation of the second main surface VS2 side, the small-diameter loop shaped conductor 32, which is located adjacent to the second main surface VS2 in the Z-axis direction, is displaced so as to contract (see the blank arrows DF2 in FIG. 3B).

As illustrated in FIGS. 3A and 3B, the large-diameter loop shaped conductor 31 is disposed at a position (a position closer to the first main surface VS1) such that the inner and outer diameters thereof relatively extend along the insulating base material 10 compared with the other loop shaped conductor (the small-diameter loop shaped conductor 32) when the inductor bridge 101 is bent. More specifically, the large-diameter loop shaped conductor 31 is disposed at a position such that the inner diameter (L1$b$) of the large-diameter loop shaped conductor 31 after the inductor bridge 101 has been bent is larger than the inner diameter (L1$a$) of the large-diameter loop shaped conductor 31 before the inductor bridge 101 is bent (L1$a$<L1$b$). Therefore, after the inductor bridge 101 has been bent as illustrated in FIG. 3B, the large-diameter loop shaped conductor 31 and the other loop shaped conductor (the small-diameter loop shaped conductor 32) do not overlap as viewed in the Z-axis direction (do not oppose each other face to face). Accordingly, the amount of change in interlayer capacitance between the large-diameter loop shaped conductor 31 and the other loop shaped conductor (the small-diameter loop shaped conductor 32) is small.

Figure 4:
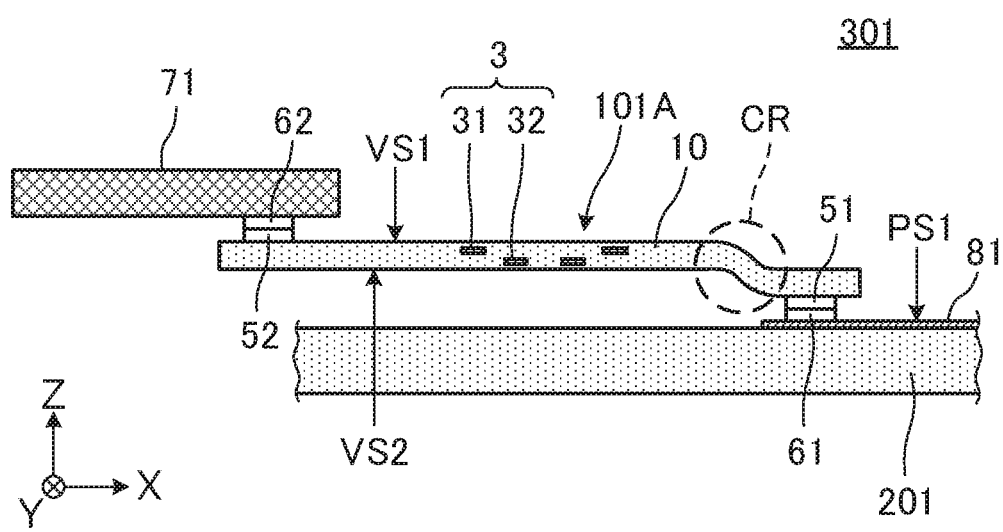
FIG. 4 is a sectional view of a main portion of an electronic device 301 according to the first preferred embodiment of the present invention.

Next, an electronic device including an inductor bridge according to a preferred embodiment of the present invention will be described with reference to the drawings. FIG. 4 is a sectional view of a main portion of an electronic device 301 according to the first preferred embodiment.

The electronic device 301 includes an inductor bridge 101A, a circuit board 71, and a mounting board 201. In the present preferred embodiment, a circuit provided in contact with the circuit board 71 corresponds to a "first circuit", and a circuit provided in contact with the mounting board 201 corresponds to a "second circuit". The inductor bridge 101A differs from the inductor bridge 101 in that the insulating base material 10 includes a bent portion CR (a portion that is bent). In other respects, the inductor bridge 101A is the same or substantially the same as the inductor bridge 101.

As illustrated in FIG. 4, the inductor bridge 101A is connected to the circuit board 71 and the mounting board 201.

A conductor 81 is provided on the upper surface of the mounting board 201. A receptacle 61 is connected to the conductor 81 and is electrically connected to the second circuit provided in contact with the mounting board 201. The mounting board 201 is, for example, a printed circuit board.

A receptacle 62 is mounted on the lower surface of the circuit board 71. The receptacle 62 is electrically connected to the first circuit provided in contact with the circuit board 71. The first circuit is, for example, a radiating element of a UHF antenna.

The connector 51 of the inductor bridge 101A is connected to the receptacle 61, and the connector 52 of the inductor bridge 101A is connected to the receptacle 62.

Figure 5:
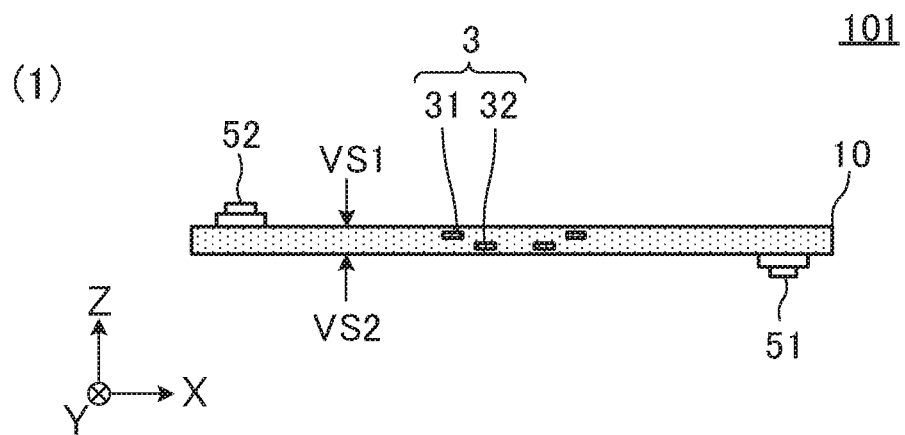
FIG. 5 is a sectional view illustrating successive manufacturing steps of an inductor bridge 101A.
Figure 5:
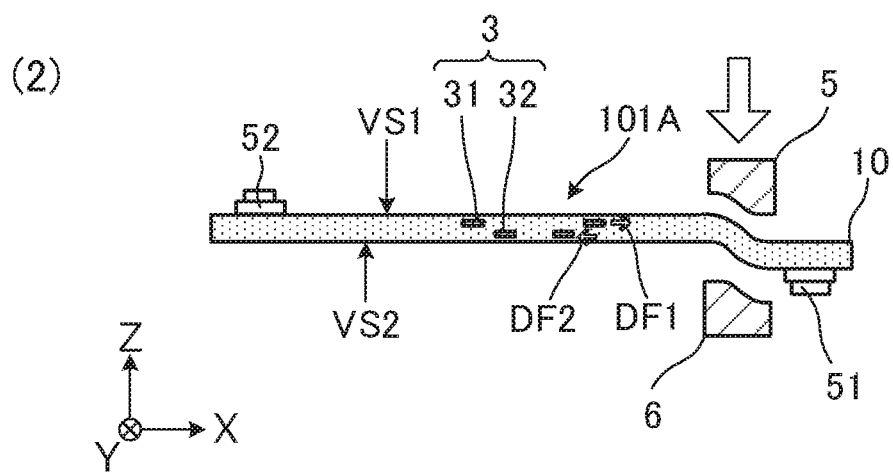

The inductor bridge 101A according to the present preferred embodiment is manufactured, for example, through the following process. FIG. 5 is a sectional view illustrating the successive manufacturing steps of the inductor bridge 101A.

First, the inductor bridge 101 illustrated in part (1) of FIG. 5 is obtained by forming a multilayer body by stacking base material layers on which a small-diameter loop shaped conductor, a large-diameter loop shaped conductor, a conductor, an electrode, and other suitable elements are patterned; coating the multilayer body with a protective layer; and separating individual elements from an insulating base material in the collective substrate state.

Next, as illustrated in part (2) of FIG. 5, by using an upper die 5 and a lower die 6, the first main surface VS1 and the second main surface VS2 of the insulating base material 10 are heat-pressed in the Z-axis direction (see the arrow in part (2) of FIG. 5). The heat-pressed position is a position between the first end (the right end of the insulating base material 10) of the insulating base material 10 and the center of the insulating base material 10 in the longitudinal direction (X-axis direction). The upper die 5 and the lower die 6 each have a structure such that the sectional shape thereof is bent into a predetermined shape.

Subsequently, the inductor bridge 101A is removed from the upper die 5 and the lower die 6. With this manufacturing method, the inductor bridge 101A including the bent portion CR (a portion that is bent) is obtained.

The inductor bridges 101 and 101A according to the present preferred embodiment provide the following advantages.

In the present preferred embodiment, a plurality of loop shaped conductors (the large-diameter loop shaped conductor 31 and the small-diameter loop shaped conductor 32), which have different inner and outer diameters, are arranged in the Z-axis direction. The large-diameter loop shaped conductor 31 does not overlap the other loop shaped conductor (the small-diameter loop shaped conductor 32) as viewed in the Z-axis direction. With this structure, the loop shaped conductors (the large-diameter loop shaped conductor 31 and the small-diameter loop shaped conductor 32) do not oppose each other face to face, and therefore, the interlayer capacitance between the plurality of loop shaped conductors is small.

In the present preferred embodiment, the other loop shaped conductor (the small-diameter loop shaped conductor 32) is disposed inside of the opening BR surrounded by the large-diameter loop shaped conductor 31 as viewed in the Z-axis direction, and the large-diameter loop shaped conductor 31 and the other loop shaped conductor do not overlap each other as viewed in the Z-axis direction. The large-diameter loop shaped conductor 31 is disposed at a position such that the inner and outer diameters thereof relatively extend along the insulating base material 10 compared with the other loop shaped conductor when the inductor bridge 101 is bent. With this structure, even when the inductor bridge 101 is bent into an L-shape such that the second main surface VS2 is on the inner side, the plurality of loop shaped conductors (the large-diameter loop shaped conductor 31 and the small-diameter loop shaped conductor 32) do not oppose each other face to face. Therefore, changes in interlayer capacitance between the plurality of loop shaped conductors are reduced or prevented, and variation in electric characteristics of the conical coil 3 is reduced or prevented.

In the present preferred embodiment, the following example has been described: the large-diameter loop shaped conductor 31 is disposed at a position (a position between the first main surface VS1 and the neutral plane of the insulating base material 10) such that the inner and outer diameters thereof extend along the insulating base material 10 when the inductor bridge 101 is bent, and the other loop shaped conductor (the small-diameter loop shaped conductor 32) is disposed at a position (a position between the second main surface VS2 and the neutral plane of the insulating base material 10) such that the inner and outer diameters thereof contract along the insulating base material 10 when the inductor bridge 101 is bent. However, this structure is not a limitation. The loop shaped conductors may be disposed at any positions such that the inner and outer diameters of the large-diameter loop shaped conductor 31 "relatively" extend compared with the other loop shaped conductor along the insulating base material 10 when the inductor bridge is bent.

More specifically, provided that the inner and outer diameters of the large-diameter loop shaped conductor 31 "relatively" extend compared with the other loop shaped conductor when the inductor bridge 101 is bent, the large-diameter loop shaped conductor 31 and the other loop shaped conductor may each be disposed at a position (a position between the neutral plane of the insulating base material 10 and the first main surface VS1) such that the inner and outer diameters thereof extend. Alternatively, provided that the inner and outer diameters of the large-diameter loop shaped conductor 31 "relatively" extend compared with the other loop shaped conductor when the inductor bridge 101 is bent, the large-diameter loop shaped conductor 31 and the other loop shaped conductor may each be disposed at a position (a position between the neutral plane of the insulating base material 10 and the second main surface VS2) such that the inner and outer diameters thereof contract. Further alternatively, provided that the inner and outer diameters of the large-diameter loop shaped conductor 31 "relatively" extend compared with the other loop shaped conductor when the inductor bridge 101 is bent, one of the large-diameter loop shaped conductor 31 and the other loop shaped conductor may be disposed on the neutral plane of the insulating base material 10. The same applies to preferred embodiments described below.

In the present preferred embodiment, the conical coil 3 includes the small-diameter loop shaped conductor 32 and the large-diameter loop shaped conductor 31, which are respectively provided on the plurality of the base material layers 12 and 13. With this structure, it is possible to provide a conical coil including a predetermined number of turns and a predetermined inductance in the insulating base material 10.

In the present preferred embodiment, because the insulating base material 10 is a thermoplastic resin, as illustrated in part (2) of FIG. 5, the shape of the insulating base material 10 is able to be plastically deformed (bent) easily in accordance with the mounting state (such as protrusions and recesses of an object on which the inductor bridge 101 is to be mounted).

Second Preferred Embodiment

In a second preferred embodiment of the present invention, structures that differ from that of the electronic device described in the first preferred embodiment will be described.

Figure 6:
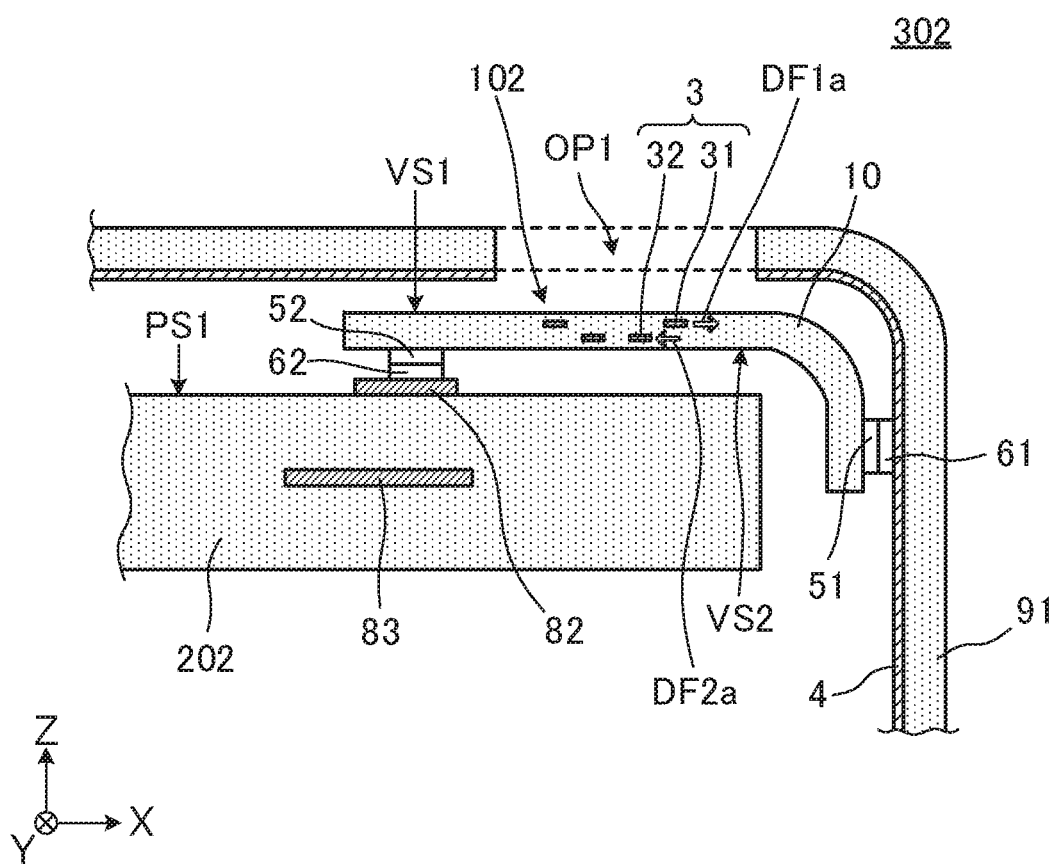
FIG. 6 is a sectional view of a main portion of an electronic device 302 according to a second preferred embodiment of the present invention.

FIG. 6 is a sectional view of a main portion of an electronic device 302 according to the second preferred embodiment.

The electronic device 302 includes an inductor bridge 102, a resin casing 91, and a mounting board 202. A conductor pattern 4 is provided on an inner surface of the resin casing 91. The conductor pattern 4 is preferably, for example, a ground conductor.

In the present preferred embodiment, a circuit in contact with the mounting board 202 corresponds to a "first circuit", and a circuit (ground conductor) in contact with the resin casing 91 corresponds to a "second circuit".

As illustrated in FIG. 6, the inductor bridge 102 is connected to the conductor pattern 4 on the resin casing 91 and to a conductor 82 on the mounting board 202. The inductor bridge 102 differs from the inductor bridge 101 in that a portion thereof is bent. In other respects, the inductor bridge 102 is the same or substantially the same as the inductor bridge 101.

The conductor 82 is provided on the upper surface of the mounting board 202, and a conductor 83 is provided in the mounting board 202. A receptacle 62 is connected to the conductor 82 and is electrically connected to the first circuit in contact with the mounting board 202. The mounting board 202 is, for example, a printed circuit board.

A receptacle 61 is mounted on the inner surface of the resin casing 91. The receptacle 61 is electrically connected to the conductor pattern 4 (ground conductor) provided on the inner surface of the resin casing 91.

A connector 51 of the inductor bridge 102 is connected to the receptacle 61, and a connector 52 of the inductor bridge 102 is connected to the receptacle 62. In a state in which the inductor bridge 102 is connected to the mounting board 202 and the resin casing 91, a portion of the inductor bridge 102 in which a conical coil 3 is provided is exposed from an opening OP1 provided in the resin casing 91. Therefore, the conical coil 3 is not electromagnetically shielded. Accordingly, the inductor bridge 102 is able to be used as an antenna, with which communication with the outside is enabled.

In a state in which the inductor bridge 102 is connected to the mounting board 202 and the conductor pattern 4 on the resin casing 91, the inductor bridge 102 is bent at a position between the center of an insulating base material 10 in the longitudinal direction and a second end (the right end of the insulating base material 10 in FIG. 6) of the insulating base material 10. More specifically, as illustrated in FIG. 6, a portion of the inductor bridge 102 in which the conical coil 3 is not provided is bent into an L-shape.

Figure 7A:
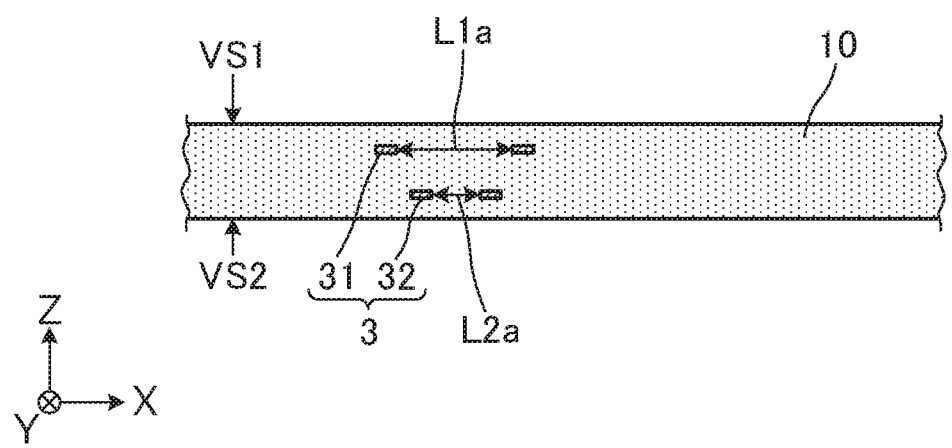
FIG. 7A is a partial sectional view of an inductor bridge 102 before being bent.

Next, the case in which a portion of the inductor bridge in which the conical coil 3 is not provided is bent into an L-shape will be described with reference to the drawings. FIG. 7A is a partial sectional view of the inductor bridge 102 before being bent, and FIG. 7B is a partial sectional view of the inductor bridge 102 after having been bent.

Figure 7B:
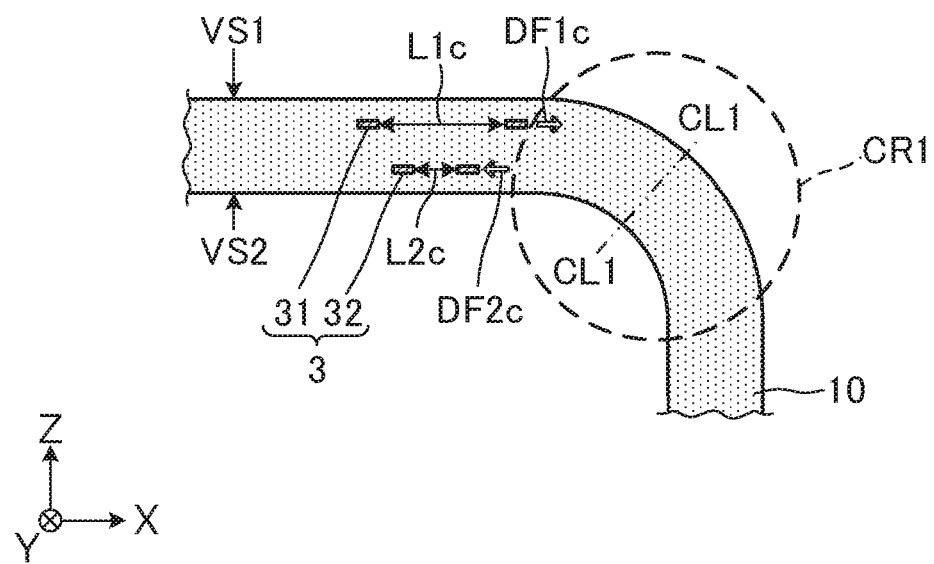
FIG. 7B is a partial sectional view of the inductor bridge 102 after having been bent.

As illustrated in FIG. 7B, a bent portion CR1 of the inductor bridge 102 is bent into an L-shape. In the inductor bridge 102, the conical coil 3 is located near the left side of the bent portion CR1. In this case, in accordance with flexural displacement of the insulating base material 10, a stress is applied to the first main surface VS1 side in the +X direction, and a stress is applied to the second main surface VS2 side in the −X direction. Therefore, a large-diameter loop shaped conductor 31, which is located closer to the first main surface VS1 in the Z-axis direction, is displaced such that the inner and outer diameters thereof extend (see the blank arrow DF1$c$ in FIG. 7B). The other loop shaped conductor (a small-diameter loop shaped conductor 32), which is located closer to the second main surface VS2 in the Z-axis direction, is displaced such that the inner and outer diameters thereof contract (see the blank arrow DF2$c$ in FIG. 7B). That is, the large-diameter loop shaped conductor 31 is disposed at a position such that the inner diameter (L1$c$) of the large-diameter loop shaped conductor 31 after the inductor bridge 102 has been bent is larger than the inner diameter (L1$a$) of the large-diameter loop shaped conductor 31 before the inductor bridge 102 is bent (L1$a$<L1$c$).

Accordingly, even when the inductor bridge 102 is bent as illustrated in FIG. 7B, the large-diameter loop shaped conductor 31 and the other loop shaped conductor do not overlap as viewed in the Z-axis direction. Therefore, the amount of change in interlayer capacitance between the large-diameter loop shaped conductor 31 and the other loop shaped conductor is small.

Next, cases in which inductor bridges are bent into different shapes will be described with reference to the drawings.

Figure 8A:
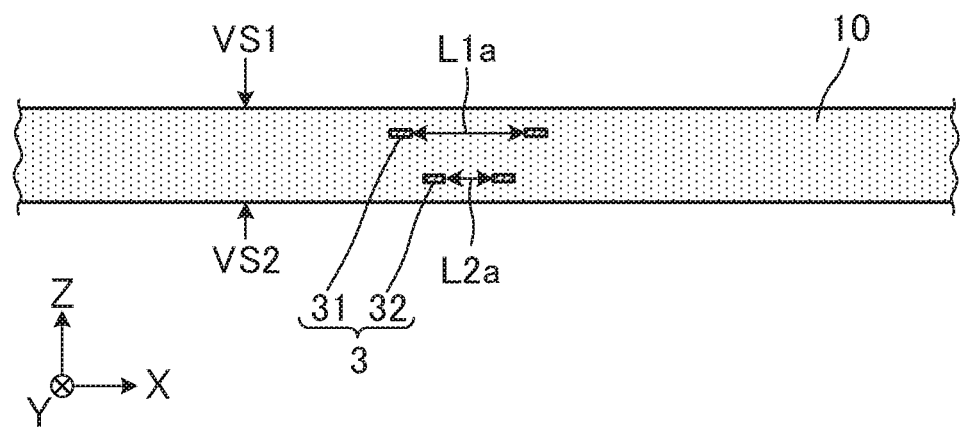
FIG. 8A is a partial sectional view of another example of an inductor bridge 102A according to the second preferred embodiment of the present invention before being bent.
Figure 8B:
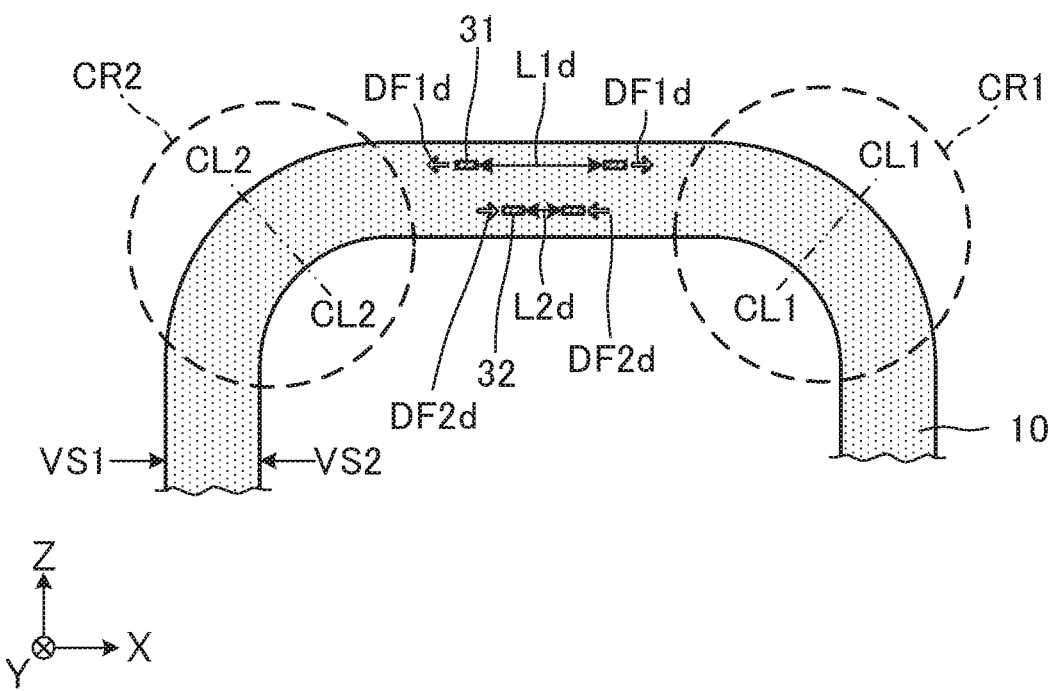
FIG. 8B is a partial sectional view of the inductor bridge 102A after having been bent.

FIG. 8A is a partial sectional view of another example of an inductor bridge 102A according to the second preferred embodiment before being bent, and FIG. 8B is a partial sectional view of the inductor bridge 102A after having been bent. The inductor bridge 102A differs from the inductor bridge 102 in that the insulating base material 10 is bent into a U-shape along the longitudinal direction (X-axis direction). In other respects, the inductor bridge 102A is the same or substantially the same as the inductor bridge 102.

As illustrated in FIG. 8B, bent portions CR1 and CR2 of the inductor bridge 102A are each bent into an L-shape such that a second main surface VS2 is on the inner side. In the inductor bridge 102, a conical coil 3 is disposed between the bent portion CR1 and the bent portion CR2.

In this case, with flexural displacement of the insulating base material 10, a tensile stress is applied to the first main surface VS1 side in the X-axis direction, and a compressive stress is applied to the second main surface VS2 side in the X-axis direction. Therefore, a large-diameter loop shaped conductor 31, which is located closer to the first main surface VS1 in the Z-axis direction, is displaced such that the inner and outer diameters thereof extend (see the blank arrow DF1$d$ in FIG. 8B). The other loop shaped conductor (a small-diameter loop shaped conductor 32), which is located closer to the second main surface VS2 in the Z-axis direction, is displaced such that the inner and outer diameters thereof contract (see the blank arrow DF2$d$ in FIG. 8B). That is, the large-diameter loop shaped conductor 31 is disposed at a position such that the inner diameter (L1$d$) of the large-diameter loop shaped conductor 31 after the inductor bridge 102A has been bent as illustrated in FIG. 8B is larger than the inner diameter (L1$a$) of the large-diameter loop shaped conductor 31 before the inductor bridge 102A is bent (L1$a$<L1$d$).

Accordingly, even when the inductor bridge 102A is bent as illustrated in FIG. 8B, the large-diameter loop shaped conductor 31 and the other loop shaped conductor do not overlap as viewed in the Z-axis direction. Therefore, the amount of change in interlayer capacitance between the large-diameter loop shaped conductor 31 and the other loop shaped conductor is small.

Figure 9A:
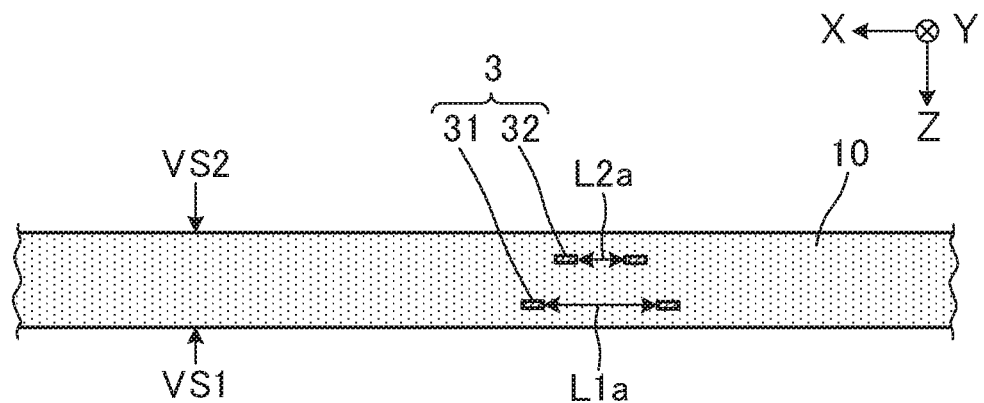
FIG. 9A is a partial sectional view of another example of an inductor bridge 102B according to the second preferred embodiment of the present invention before being bent.
Figure 9B:
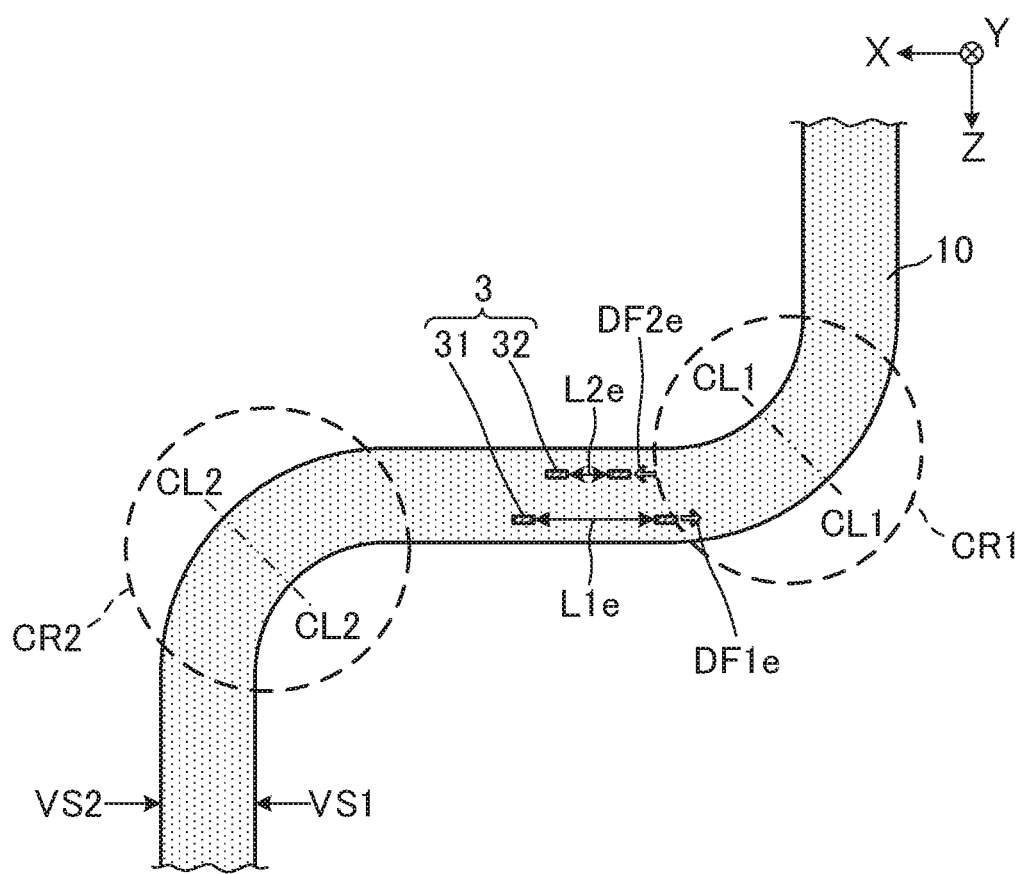
FIG. 9B is a partial sectional view of the inductor bridge 102B after having been bent.
Figure 10A:
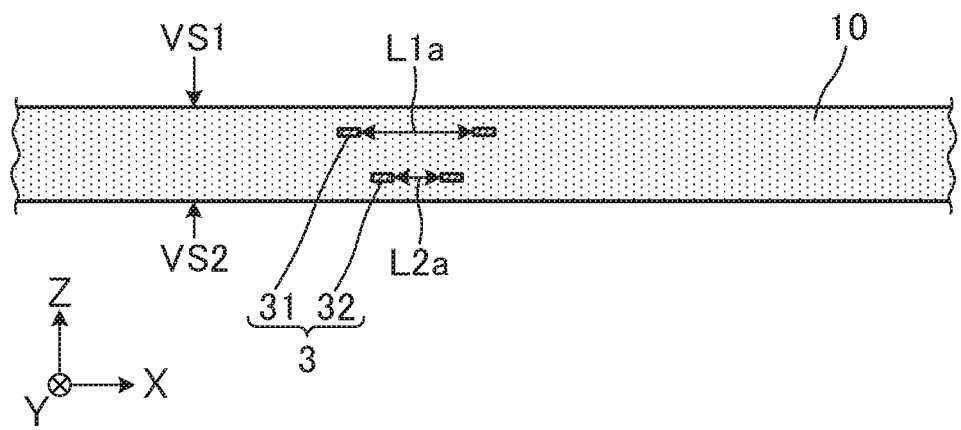
FIG. 10A is a partial sectional view of another example of an inductor bridge 102C according to the second preferred embodiment of the present invention before being bent.

FIG. 9A is a partial sectional view of an inductor bridge 102B according to the second preferred embodiment before being bent, and FIG. 9B is a partial sectional view of an inductor bridge 102B after having been bent. FIG. 10A is a partial sectional view of an inductor bridge 102C according to the second preferred embodiment before being bent, and FIG. 10B is a partial sectional view of an inductor bridge 102C after having been bent.

The inductor bridges 102B and 102C differ from the inductor bridge 102 in that an insulating base material 10 is bent into a Z-shape along the longitudinal direction (X-axis direction). In other respects, the inductor bridges 102B and 102C are the same as the inductor bridge 102.

Figure 10B:
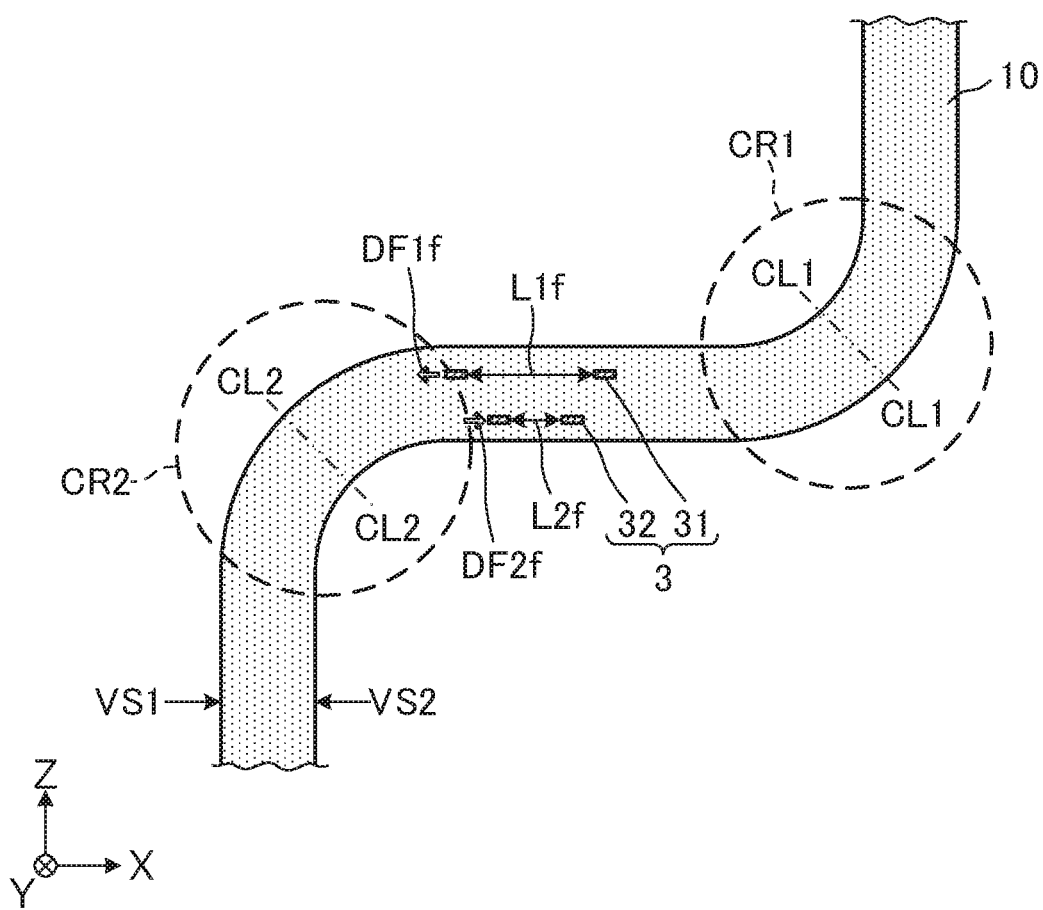
FIG. 10B is a partial sectional view of the inductor bridge 102C after having been bent.

As illustrated in FIGS. 9B and 10B, a bent portion CR1 of each of the inductor bridges 102B and 102C is bent into an L-shape such that a second main surface VS2 is on the inner side, and a bent portion CR2 of each of the inductor bridges 102B and 102C is bent into an L-shape with a first main surface VS1 on the inner side.

The amount of deformation of a certain portion of the insulating base material when the inductor bridge is bent depends on the distance from the centerline (a line at the mid-position between the starting point and the endpoint of the bent portion) of the bent portion adjacent to the certain portion. In the inductor bridge 102B, a conical coil 3 is disposed at a position closer to a centerline CL1 than to a centerline CL2.

In this case, with flexural displacement of the insulating base material 10, a stress is applied to the first main surface VS1 side mainly in the +X direction, and a stress is applied to the second main surface VS2 side mainly in the −X direction. Therefore, a large-diameter loop shaped conductor 31, which is located closer to the first main surface VS1 in the Z-axis direction, is displaced such that the inner and outer diameters thereof extend (see the blank arrow DF1$e$ in FIG. 9B). The other loop shaped conductor (a small-diameter loop shaped conductor 32), which is located closer to the second main surface VS2 in the Z-axis direction, is displaced such that the inner and outer diameters thereof contract (see the blank arrow DF2$e$ in FIG. 9B). That is, the large-diameter loop shaped conductor 31 is disposed at a position such that the inner diameter (L1$e$) of the large-diameter loop shaped conductor 31 after the inductor bridge 102B has been bent as illustrated in FIG. 9B is larger than the inner diameter (L1$a$) of the large-diameter loop shaped conductor 31 before the inductor bridge 102B is bent (L1$a$<L1$e$).

In the inductor bridge 102C, the conical coil 3 is disposed at a position between the bent portion CR1 and the bent portion CR2 and closer to the bent portion CR2 than to the bent portion CR1.

The amount of deformation of a certain portion of the insulating base material when the inductor bridge is bent depends on the distance from the centerline (a line at the mid-position between the starting point and the endpoint of the bent portion) of the bent portion adjacent to the certain portion. In the inductor bridge 102C, a conical coil 3 is disposed at a position closer to the centerline CL2 than to the centerline CL1.

In this case, with flexural displacement of the insulating base material 10, a stress is applied to the first main surface VS1 side mainly in the −X direction, and a stress is applied to the second main surface VS2 side mainly in the +X direction. Therefore, a large-diameter loop shaped conductor 31, which is located closer to the first main surface VS1 in the Z-axis direction, is displaced such that the inner and outer diameters thereof extend (see the blank arrow DF1$f$ in FIG. 10B). The other loop shaped conductor (a small-diameter loop shaped conductor 32), which is located closer to the second main surface VS2 in the Z-axis direction, is displaced such that the inner and outer diameters thereof contract (see the blank arrow DF2$f$ in FIG. 10B). That is, the large-diameter loop shaped conductor 31 is disposed at a position such that the inner diameter (L1$f$) of the large-diameter loop shaped conductor 31 after the inductor bridge 102C has been bent as illustrated in FIG. 10B is larger than the inner diameter (L1$a$) of the large-diameter loop shaped conductor 31 before the inductor bridge 102C is bent (L1$a$<L1$f$).

By disposing the conical coil 3 as illustrated in FIGS. 9B and 10B as described above, even when the inductor bridges 102B and 102C are each bent into a Z-shape, the large-diameter loop shaped conductor 31 and the other loop shaped conductor (the small-diameter loop shaped conductor 32) do not oppose each other face to face. Therefore, the amount of change in interlayer capacitance between the large-diameter loop shaped conductor 31 and the other loop shaped conductor due to bending of the inductor bridges 102B and 102C is small.

In the present preferred embodiment, examples in which the inductor bridge 102 is connected to the conductor pattern 4, which is provided on the inner surface of the resin casing 91, via the receptacle 61 have been described. However, this structure is not a limitation. When the electronic device includes a metal casing, the inductor bridge may be connected to the metal casing by using a screw or other suitable connector.

Third Preferred Embodiment

In a third preferred embodiment of the present invention, an example of an inductor bridge including a conical coil having a different structure will be described.

Figure 11A:
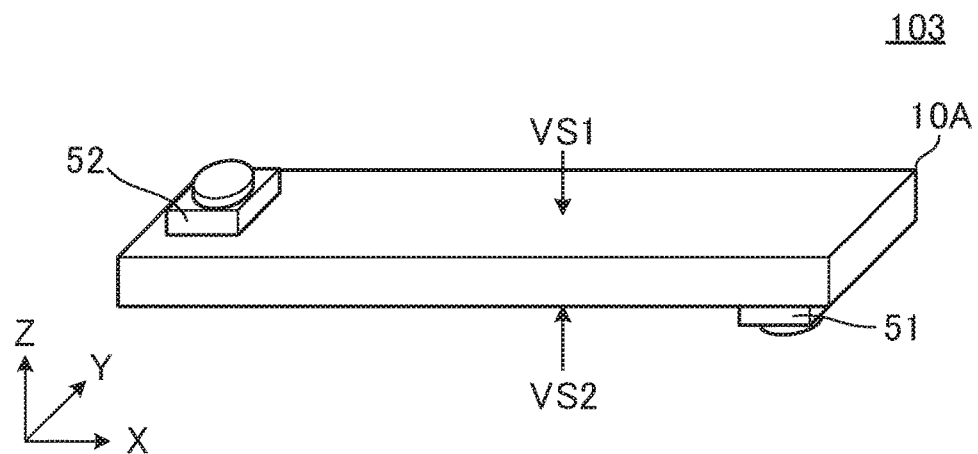
FIG. 11A is a perspective view of an inductor bridge 103 according to a third preferred embodiment of the present invention.
Figure 11B:
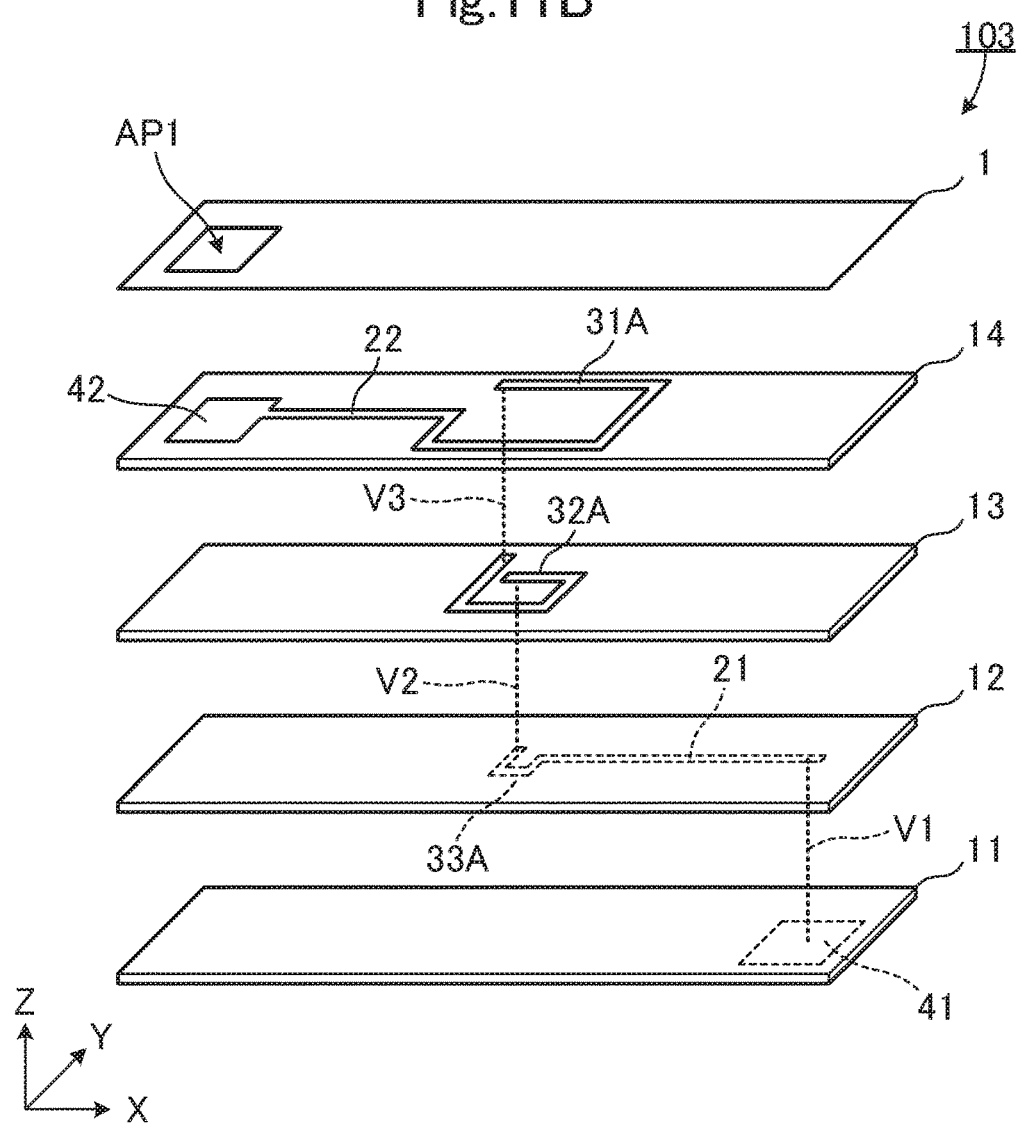
FIG. 11B is an exploded perspective view of the inductor bridge 103.
Figure 12A:
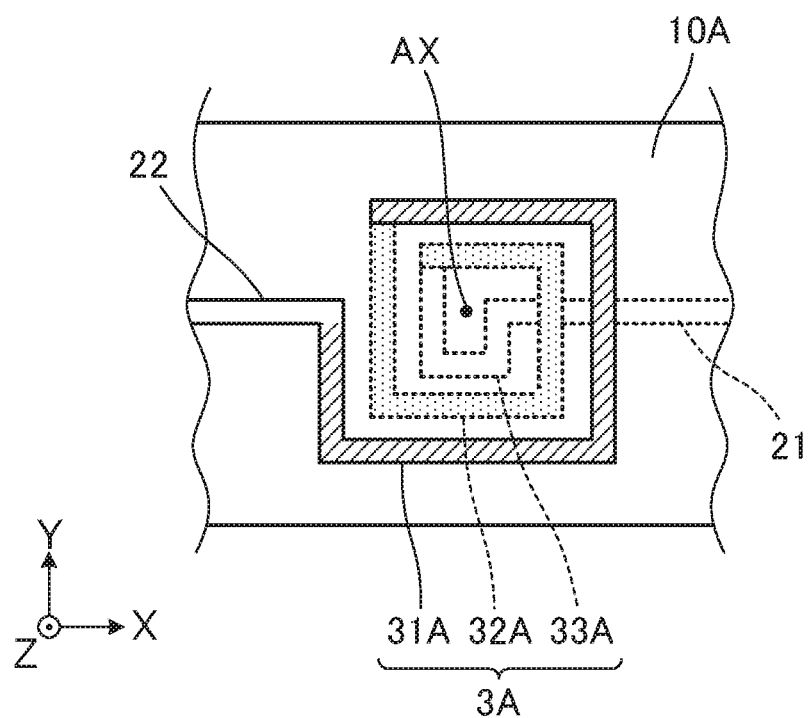
FIG. 12A is a plan view of a portion of the inductor bridge 103 in which a conical coil 3A is provided.
Figure 12B:
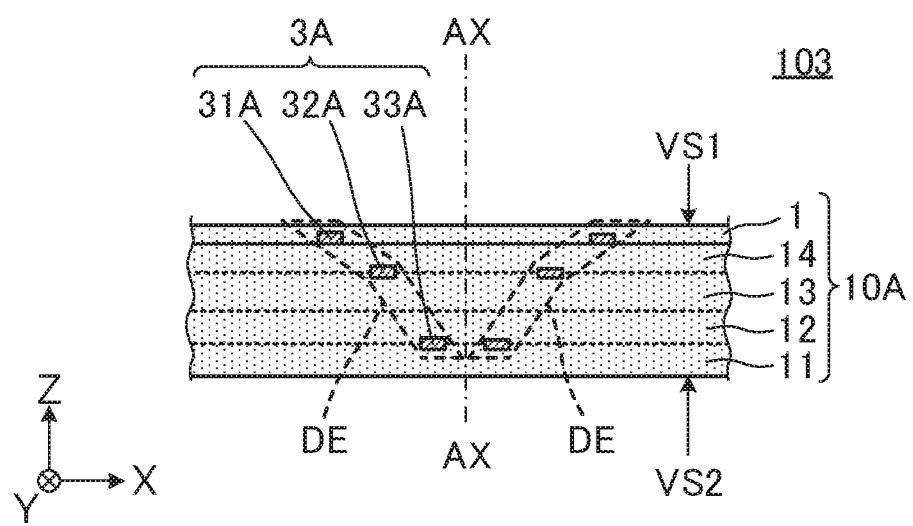
FIG. 12B is a sectional view of the portion.

FIG. 11A is a perspective view of an inductor bridge 103 according to the third preferred embodiment, and FIG. 11B is an exploded perspective view of the inductor bridge 103. FIG. 12A is a plan view of a portion of the inductor bridge 103 in which a conical coil 3A is provided, and FIG. 12B is a sectional view of the portion. In FIG. 12A, for ease of understanding the structure, a protective layer 1 and a base material layer 14 are not illustrated, a large-diameter loop shaped conductor 31A is shown by hatching, and a small-diameter loop shaped conductor 32A is shown by a dot pattern.

The inductor bridge 103 includes an insulating base material 10A, a conical coil 3A (described below in detail) in contact with the insulating base material 10A, and connectors 51 and 52.

The insulating base material 10A includes a first main surface VS1 and a second main surface VS2 facing the first main surface VS1. The insulating base material 10A is preferably, for example, a flat thermoplastic-resin plate having a rectangular or substantially rectangular parallelepiped shape whose longitudinal direction coincides with the X-axis direction. The insulating base material 10A is a multilayer body including material layers 11, 12, 13, and 14, and a protective layer 1 that are stacked; and has flexibility.

An electrode 41 is provided on the back surface of the base material layer 11. The electrode 41 is a conductor pattern that is disposed near a first end (the right end of the base material layer 11 in FIG. 11B) of the base material layer 11 and that has a rectangular or substantially rectangular planar shape.

A small-diameter loop shaped conductor 33A and a conductor 21 are provided on the back surface of the base material layer 12. The small-diameter loop shaped conductor 33A is a rectangular or substantially rectangular loop shaped conductor pattern preferably including about 0.7 turns or more, for example, and is provided near the center of the base material layer 12. The conductor 21 is a linear conductor pattern that extends in the X-axis direction, and is disposed between a first end of the base material layer 12 and the center of the base material layer 12. The small-diameter loop shaped conductor 33A and the conductor 21 are continuously provided, and a first end of the small-diameter loop shaped conductor 33A is connected to a first end of the conductor 21. A second end of the conductor 21 is connected to the electrode 41 via an interlayer connection conductor V1 provided in each of the base material layer 11 and 12.

The small-diameter loop shaped conductor 32A is provided on the front surface of the base material layer 13. The small-diameter loop shaped conductor 32A is a rectangular or substantially rectangular loop shaped conductor pattern preferably including about 1 turn, for example, and being provided near the center of the base material layer 13. As illustrated in FIG. 12A, the inner and outer diameters of the small-diameter loop shaped conductor 32A are larger than those of the small-diameter loop shaped conductor 33A. A first end of the small-diameter loop shaped conductor 32A is connected to a second end of the small-diameter loop shaped conductor 33A via an interlayer connection conductor V2 provided in each of the base material layers 12 and 13.

The large-diameter loop shaped conductor 31A, a conductor 22, and an electrode 42 are provided on the front surface of the base material layer 14. The large-diameter loop shaped conductor 31A is a rectangular or substantially rectangular loop shaped conductor pattern preferably including about 0.8 turns, for example, and being provided near the center of the base material layer 14. As illustrated in FIG. 12A, the inner and outer diameters of the large-diameter loop shaped conductor 31A are larger than those of the small-diameter loop shaped conductors 32A and 33A. The conductor 22 is a linear conductor pattern that extends in the X-axis direction, and is disposed between a second end (the left end of the base material layer 14 in FIG. 11B) of the base material layer 14 and the center of the base material layer 14. The electrode 42 is a conductor pattern that is disposed near the second end (the left end of the base material layer 14 in FIG. 11B) of the base material layer 14 and that has a rectangular or substantially rectangular planar shape. A first end of the large-diameter loop shaped conductor 31A is connected to a second end of the small-diameter loop shaped conductor 32A via an interlayer connection conductor V3 provided in the base material layer 14. A second end of the large-diameter loop shaped conductor 31A is connected to a first end of the conductor 22, and a second end of the conductor 22 is connected to the electrode 42.

The protective layer 1 has the same or substantially the same planar shape as the base material layer 14 and is disposed on the front surface of the base material layer 14. The protective layer 1 includes an opening AP1 corresponding to the position of the electrode 42. Therefore, even when the protective layer 1 is disposed on the front surface of the base material layer 14, the electrode 42 is exposed on the first main surface VS1 of the insulating base material 10A.

The connector 51 is provided on the second main surface VS2 of the insulating base material 10A and is disposed near a first end (the right end of the insulating base material 10A in FIG. 11A) of the insulating base material 10A in the longitudinal direction. The connector 51 is connected to the electrode 41. The connector 52 is provided on the first main surface VS1 of the insulating base material 10A and is disposed near a second end (the left end of the insulating base material 10A) of the insulating base material 10A in the longitudinal direction. The connector 52 is connected to the electrode 42.

In the inductor bridge 103, the rectangular or substantially rectangular conical coil 3A preferably including about 2.5 turns, for example, includes the large-diameter loop shaped conductor 31A, the small-diameter loop shaped conductors 32A and 33A, and the interlayer connection conductors V1 and V2, which are in contact with the plurality of base material layers 12, 13, and 14. As illustrated in FIG. 12B, the conical coil 3A has a winding axis AX that is perpendicular or substantially perpendicular to the first main surface VS1 and the second main surface VS2 (in parallel or substantially in parallel to the Z-axis direction).

As illustrated in FIG. 12A, as viewed in the Z-axis direction, the small-diameter loop shaped conductors 32A and 33A are disposed inside of the opening surrounded by the large-diameter loop shaped conductor 31A.

Inner and outer diameters of the plurality of loop shaped conductors change in one way in the Z-axis direction. More specifically, in the present preferred embodiment, as shown by the outline DE of the conical coil 3A in FIG. 12B, the inner and outer diameters of the plurality of loop shaped conductors change such that the inner and outer diameters increase in the +Z direction (from the second main surface VS2 side toward the first main surface VS1 side).

As described above, the number of "the other loop shaped conductors" (loop shaped conductors other than the large-diameter loop shaped conductor) may include a plurality of loop shaped conductors. Also in this case, the plurality of loop shaped conductors (the large-diameter loop shaped conductor 31A and the small-diameter loop shaped conductors 32A and 33A) do not overlap each other as viewed in the Z-axis direction. In the present preferred embodiment, the small-diameter loop shaped conductor 32A is disposed inside of the opening surrounded by the large-diameter loop shaped conductor 31A, and the small-diameter loop shaped conductor 33A is disposed inside of the opening surrounded by the small-diameter loop shaped conductor 32A.

The inner and outer diameters of the plurality of loop shaped conductors are not limited those that uniformly change in the Z-axis direction as described in the present preferred embodiment. That is, the inner and outer diameters of the plurality of loop shaped conductors are not limited to those that change in proportion to a movement distance in the Z-axis direction. For example, the phrase "change in one way in the winding axis direction" also includes a structure in which four loop shaped conductors (including a large-diameter loop shaped conductor) are arranged in the Z-axis direction such that the inner and outer diameters thereof are in order of 2X→4X→5X→8X (where X is any number) in the +Z direction (from the second main surface side toward the first main surface side). In this case, the four loop shaped conductors do not overlap each other as viewed in the Z-axis direction. On the other hand, the phrase "change in one way in the winding axis direction" excludes a structure in which four loop shaped conductors (including the large-diameter loop shaped conductor) are arranged in the Z-axis direction such that the inner and outer diameters are in order of 2X→5X→3X→4X (where X is any number) in the +Z direction (from the second main surface side toward the first main surface side).

Fourth Preferred Embodiment

In a fourth preferred embodiment of the present invention, a conical coil in which the interline capacitance between loop shaped conductors is reduced or prevented will be described.

Figure 13A:
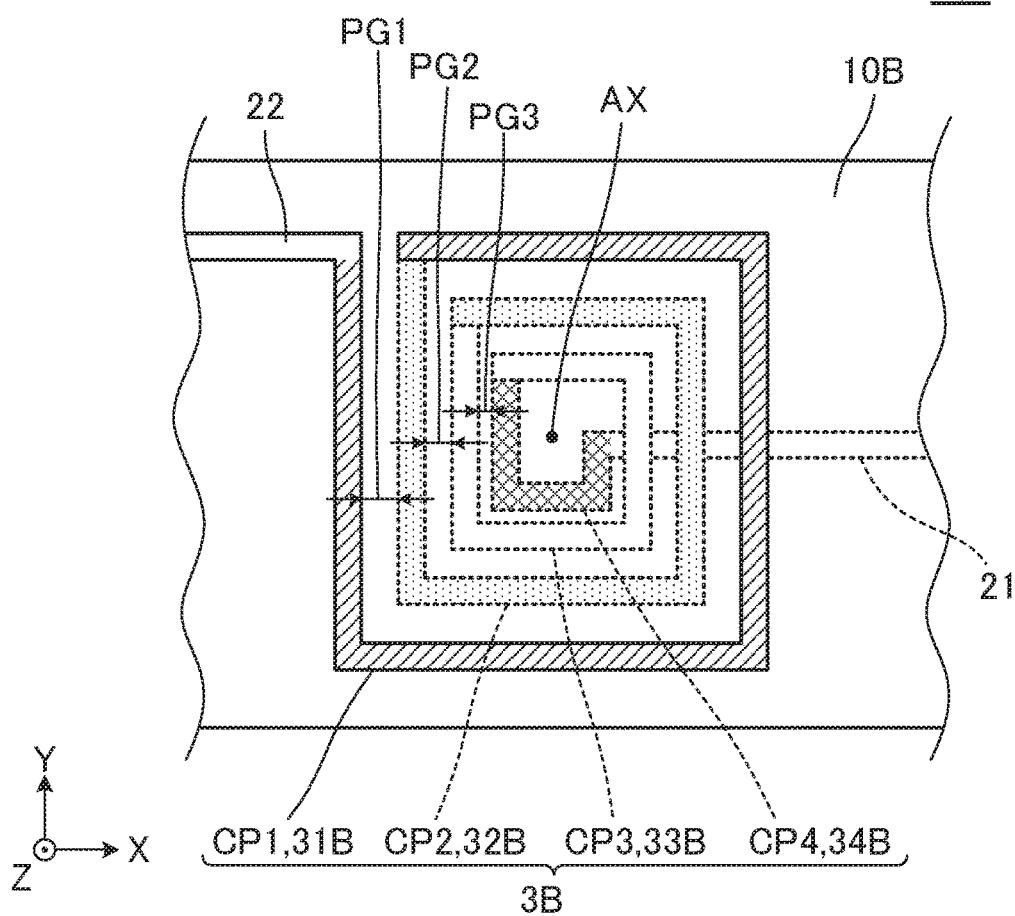
FIG. 13A is a plan view of a portion of an inductor bridge 104 according to a fourth preferred embodiment of the present invention, the portion including a conical coil 3B is provided.
Figure 13B:
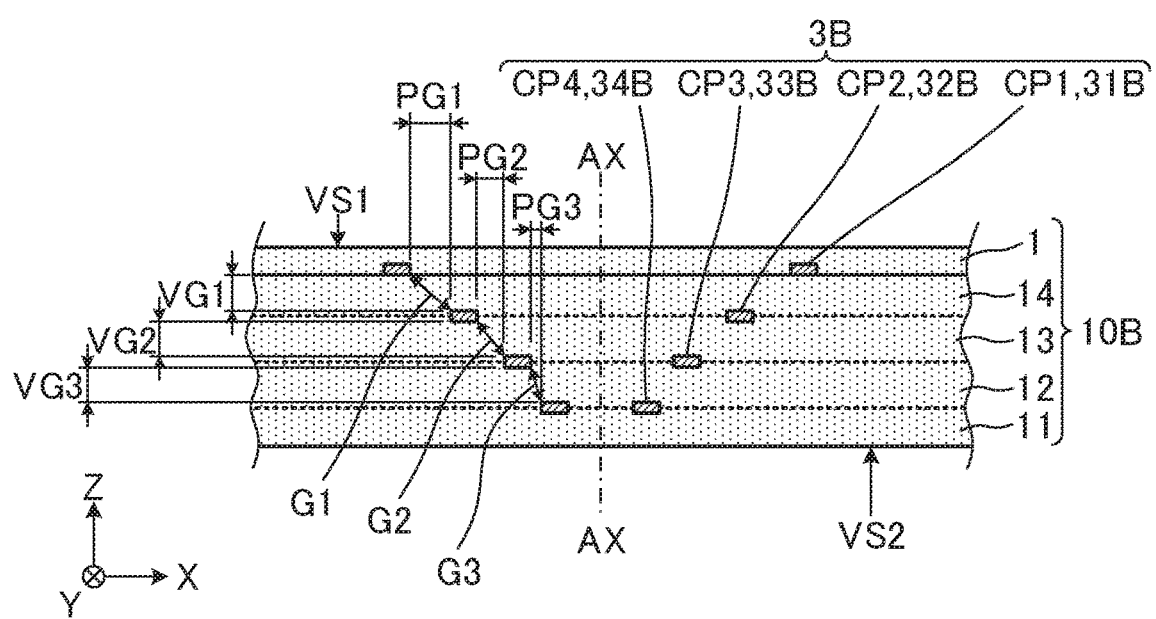
FIG. 13B is a sectional view of the portion.

FIG. 13A is a plan view of a portion of an inductor bridge 104 according to the fourth preferred embodiment, the portion including a conical coil 3B is provided, and FIG. 13B is a sectional view of the portion. In FIG. 13A, for ease of understanding the structure, a first coil portion CP1 is shown by hatching, a second coil portion CP2 is shown by a dot pattern, and a fourth coil portion CP4 is shown by cross-hatching.

The inductor bridge 104 includes an insulating base material 10B, a conical coil 3B (described below in detail) in contact with the insulating base material 10B, and other elements. The basic structure of the insulating base material 10B is the same or substantially the same as that of the insulating base material 10A according to the third preferred embodiment.

The conical coil 3B according to the present preferred embodiment includes a large-diameter loop shaped conductor 31B, a small-diameter loop shaped conductor 32B, a small-diameter loop shaped conductor 33B, a small-diameter loop shaped conductor 34B, and interlayer connection conductors (not shown). The conical coil 3B has a winding axis AX that is perpendicular or substantially perpendicular to a first main surface VS1 and a second main surface VS2 (in parallel or substantially in parallel to the Z-axis direction).

The conical coil 3B preferably includes more than 2 turns, for example, about 4.5 turns, and includes the first coil portion CP1, the second coil portion CP2, a third coil portion CP3, and the fourth coil portion CP4. The first coil portion CP1 is wound at the outermost periphery of the conical coil 3B as viewed in the Z-axis direction. The second coil portion CP2 is located at a first portion from the first coil portion CP1 to an inner periphery as viewed in the Z-axis direction. The third coil portion CP3 is located at a second portion from the first coil portion CP1 to the inner periphery as viewed in the Z-axis direction. The fourth coil portion CP4 is located at a third portion from the first coil portion CP1 to the inner periphery as viewed in the Z-axis direction.

In the present preferred embodiment, as illustrated in FIG. 13A, the large-diameter loop shaped conductor 31B including about 1 turn, for example, which is provided on the front surface of a base material layer 14, corresponds to the first coil portion CP1; and the small-diameter loop shaped conductor 32B including about 1 turn, for example, which is provided on the front surface of a base material layer 13, corresponds to the second coil portion CP2. In the present preferred embodiment, the small-diameter loop shaped conductor 33B including about 1 turn, which is provided on the front surface of a base material layer 12, corresponds to the third coil portion CP3; and the small-diameter loop shaped conductor 34B including about 0.5 turns, for example, which is provided on the front surface of a base material layer 11, corresponds to the fourth coil portion CP4.

As illustrated in FIG. 13A, the line widths of first coil portion CP1, the second coil portion CP2, the third coil portion CP3, and the fourth coil portion CP4 are equal or substantially equal to each other. The total length is larger in this order of the first coil portion CP1, the second coil portion CP2, the third coil portion CP3, and the fourth coil portion CP4. The total length of the first coil portion CP1 is larger than that of any of the other coil portions, and the total length of the fourth coil portion CP4, which is located at the innermost periphery, is smaller than that of any of the other coil portions.

The conical coil 3B includes a first gap G1, a second gap G2, and a third gap G3. The first gap G1 is between the first coil portion CP1 (the large-diameter loop shaped conductor 31B) and the second coil portion CP2 (the small-diameter loop shaped conductor 32B). The second gap G2 is between the second coil portion CP2 and the third coil portion CP3 (the small-diameter loop shaped conductor 33B). The third gap G3 is between the third coil portion CP3 and the fourth coil portion CP4 (the small-diameter loop shaped conductor 34B).

As illustrated in FIG. 13B, the first gap G1 is larger than any of the other gaps (the second gap G2 and the third gap G3). The second gap G2 is larger than third gap G3. The sizes of the gaps are larger in this order of the first gap G1, the second gap G2, and the third gap G3.

In the present preferred embodiment, as illustrated in FIG. 13B, a first gap VG1 in the Z-axis direction is equal or substantially equal to the other gaps (a second gap VG2 and a third gap VG3) in the Z-axis direction. On the other hand, in the present preferred embodiment, as illustrated in FIG. 13A, a first gap PG1 as viewed in the Z-axis direction is larger than any of the other gaps (a second gap PG2 and a third gap PG3) as viewed in the Z-axis direction. The second gap PG2 as viewed in the Z-axis direction is larger than the third gap PG3 as viewed in the Z-axis direction. Therefore, as described above, the first gap G1 is larger than any of the other gaps (the second gap G2 and the third gap G3), and the second gap G2 is larger than the third gap G3.

The inductor bridge 104 according to the present preferred embodiment has the following advantageous effects, in addition to the advantageous effects described in the third preferred embodiment.

In the present preferred embodiment, the first gap G1 is larger than any of the other gaps (the second gap G2 and the third gap G3). A portion at which the first coil portion CP1 and the second coil portion CP2 extend in parallel or substantially in parallel to each other is longer than a portion at which the other coil portions (the second coil portion CP2 and the third coil portion CP3, or the third coil portion CP3 and the fourth coil portion CP4) extend in parallel or substantially in parallel to each other. Therefore, with this structure, compared with a case in which the sizes of the other gaps (the second gap G2 and the third gap G3) are increased, the interline capacitance of the conical coil 3B is able to be effectively reduced, and the self-resonance frequency of the conical coil 3B is able to be increased.

When forming an insulating base material by stacking a plurality of base material layers, positional displacement between loop shaped conductors may occur due to stacking displacement between the base material layers, and the interline capacitance of the entirety of the conical coil may vary. As described above, because a portion at which the first coil portion CP1 and the second coil portion CP2 extend in parallel or substantially in parallel to each other is longer than a portion at which the other coil portions extend in parallel or substantially in parallel to each other, the proportion of the interline capacitance between the first coil portion CP1 and the second coil portion CP2 to the interlayer capacitance of the entirety of the conical coil is large. With the present preferred embodiment, because the first gap G1 (the gap between the first coil portion CP1 and the second coil portion CP2) is larger than any of the other gaps, even if positional displacement between loop shaped conductors occurs, variation in interline capacitance of the conical coil is able to be reduced or prevented.

Moreover, with this structure, compared with a case in which the sizes of all of the gaps (the first gap G1, the second gap G2, and the third gap G3) are equally or substantially equally increased, an increase in size of the conical coil 3B is able to be reduced or prevented, while effectively reducing the interline capacitance of the conical coil 3B.

In the present preferred embodiment, the first gap PG1 as viewed in the Z-axis direction is larger than any of the other gaps (the second gap PG2 and the third gap PG3) as viewed in the Z-axis direction. In the present preferred embodiment, the second gap G2 as viewed in the Z-axis direction is larger than the third gap G3 as viewed in the Z-axis direction. Therefore, compared with a case in which the sizes of all of the gaps (the first gap PG1, the second gap PG2, and the third gap PG3) are equally or substantially equally increased as viewed in the Z-axis direction, an increase in size of the conical coil 3B on a plane (XY plane) is able to be reduced, while effectively reducing the interline capacitance of the conical coil 3B. That is, the structure described above is effective to reduce the thickness of the conical coil in the Z-axis direction while reducing the interline capacitance of the conical coil.

In the present preferred embodiment, the second gap G2 is larger than the third gap G3. A portion at which the second coil portion CP2 and the third coil portion CP extend in parallel or substantially in parallel to each other is longer than a portion at which the third coil portion CP3 and the fourth coil portion CP4 extend in parallel or substantially in parallel to each other. Therefore, with this structure, compared with a case in which the size of the third gap G3 is increased, the interline capacitance of the conical coil 3B is able to be effectively reduced, and the self-resonance frequency of the conical coil 3B is able to be increased. That is, by increasing the gap between coil portions that are located further toward the outer periphery, the interline capacitance of the conical coil is able to be effectively reduced.

In the present preferred embodiment, the conical coil 3B including four coil portions (the first coil portion CP1, the second coil portion CP2, the third coil portion CP3, and the fourth coil portion CP4) has been described. However, this structure is not a limitation. A "conical coil" according to the preferred embodiments of present invention may include an n-th coil portion (where n is an integer larger than or equal to 2). The n-th coil portion is a portion that is located at the (n−1)-th from the first coil portion CP1 to an inner periphery as viewed in the Z-axis direction.

In the present preferred embodiment, the conical coil 3B including three gaps (the first gap G1, the second gap G2, and the third gap G3) has been described. However, this structure is not a limitation. A "conical coil" according to the present invention may include an n-th gap (where n is an integer larger than or equal to 2). The n-th gap is a gap between the n-th coil portion and the (n+1)-th coil portion. Also in this case, as described above, preferably, the first gap G1 is larger than any of the other gaps. Moreover, as described above, preferably, the n-th gap is larger than the (n+1)-th gap.

Fifth Preferred Embodiment

In a fifth preferred embodiment of the present invention, an example of a conical coil having a structure different from that of the fourth preferred embodiment will be described.

Figure 14A:
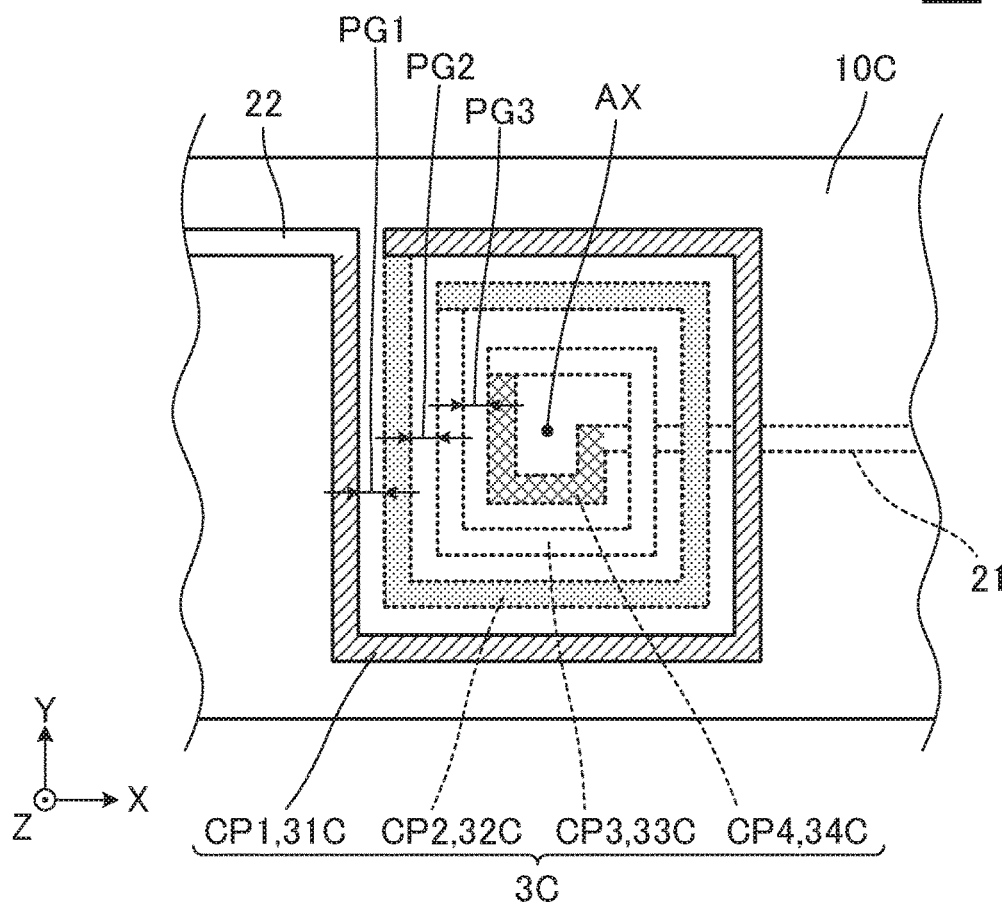
FIG. 14A is a plan view of a portion of an inductor bridge 105 according to a fifth preferred embodiment of the present invention, the portion including a conical coil 3C is provided.
Figure 14B:
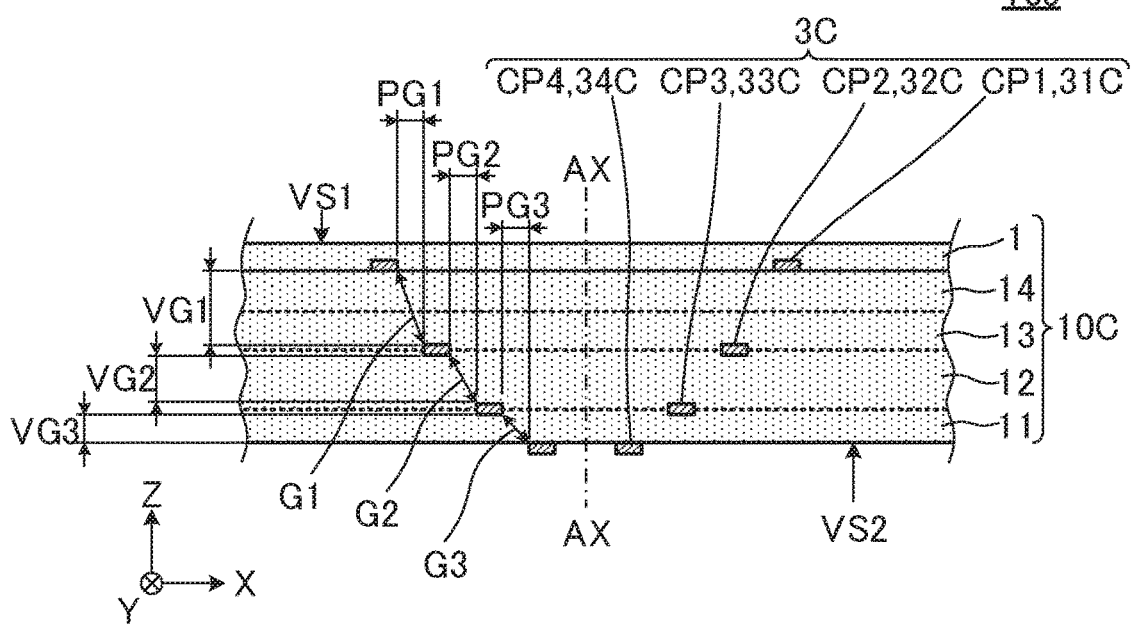
FIG. 14B is a sectional view of the portion.

FIG. 14A is a plan view of a portion of an inductor bridge 105 according to the fifth preferred embodiment, the portion including a conical coil 3C is provided, and FIG. 14B is a sectional view of the portion. In FIG. 14A, for ease of understanding the structure, a first coil portion CP1 is shown by hatching, a second coil portion CP2 is shown by a dot pattern, and a fourth coil portion CP4 is shown by cross-hatching.

The inductor bridge 105 includes an insulating base material 10C, a conical coil 3C (described below in detail) in contact with the insulating base material 10C, and other elements. The basic structure of the insulating base material 10C is the same or substantially the same as that of the insulating base material 10B according to the fourth preferred embodiment.

The conical coil 3C according to the present preferred embodiment includes a large-diameter loop shaped conductor 31C, a small-diameter loop shaped conductor 32C, a small-diameter loop shaped conductor 33C, a small-diameter loop shaped conductor 34C, and interlayer connection conductors (not shown). The conical coil 3C has a winding axis AX that is perpendicular or substantially perpendicular to a first main surface VS1 and a second main surface VS2 (in parallel to the Z-axis direction).

The conical coil 3C preferably includes more than about 2 turns, for example, about 4.5 turns, and includes the first coil portion CP1, the second coil portion CP2, a third coil portion CP3, and the fourth coil portion CP4. The first coil portion CP1, the second coil portion CP2, the third coil portion CP3, and the fourth coil portion CP4 are the same or substantially the same as those described in the fourth preferred embodiment.

In the present preferred embodiment, as illustrated in FIG. 14A, the large-diameter loop shaped conductor 31C including about 1 turn, for example, which is provided on the front surface of a base material layer 14, corresponds to the first coil portion CP1; and the small-diameter loop shaped conductor 32C including about 1 turn, for example, which is provided on the back surface of a base material layer 13, corresponds to the second coil portion CP2. In the present preferred embodiment, the small-diameter loop shaped conductor 33C including about 1 turn, for example, which is provided on the back surface of a base material layer 12, corresponds to the third coil portion CP3; and the small-diameter loop shaped conductor 34C including about 0.5 turns, for example, which is provided on the back surface of a base material layer 11, corresponds to the fourth coil portion CP4.

As illustrated in FIG. 14A, the line widths of first coil portion CP1, the second coil portion CP2, the third coil portion CP3, and the fourth coil portion CP4 are equal or substantially equal to each other.

The conical coil 3C includes a first gap G1, a second gap G2, and a third gap G3. As illustrated in FIG. 14B, the first gap G1 is larger than any of the other gaps (the second gap G2 and the third gap G3). The second gap G2 is larger than the third gap G3.

In the present preferred embodiment, as illustrated in FIG. 14A, a first gap PG1 as viewed in the Z-axis direction is equal or substantially equal to the other gaps (a second gap PG2 and a third gap PG3) as viewed in the Z-axis direction. On the other hand, in the present preferred embodiment, as illustrated in FIG. 14B, a first gap VG1 in the Z-axis direction is larger than any of the other gaps (a second gap VG2 and a third gap VG3) in the Z-axis direction. The second gap PG2 as viewed in the Z-axis direction is larger than the third gap PG3 as viewed in the Z-axis direction.

Therefore, as described above, the first gap G1 is larger than any of the other gaps (the second gap G2 and the third gap G3), and the second gap G2 is larger than the third gap G3.

Such a structure also has advantageous effects that are the same or substantially the same as those of the inductor bridge 104 according to the fourth preferred embodiment.

In the present preferred embodiment, the first gap VG1 in the Z-axis direction is larger than the any of other gaps (the second gap VG2 and the third gap VG3) in the Z-axis direction. In the present preferred embodiment, the second gap VG2 is larger than the third gap VG3 in the Z-axis direction. That is, the n-th gap in the Z-axis direction is larger than the (n+1)-th gap in the Z-axis direction. With this structure, compared with a case in which all of the gaps in the Z-axis direction (the first gap VG1, the second gap VG2, and the third gap VG3) are equally or substantially equally increased, an increase in size of the conical coil 3C in the Z-axis direction is able to be reduced or prevented, while effectively reducing the interline capacitance of the conical coil 3C.

The structure described above is effective in reducing the area of the conical coil as viewed in the Z-axis direction (the area of the conical coil on the XY plane) while reducing the interline capacitance of the conical coil.

Sixth Preferred Embodiment

In a sixth preferred embodiment of the present invention, an example of a conical coil having a structure different from those of the fourth and fifth preferred embodiments will be described.

Figure 15A:
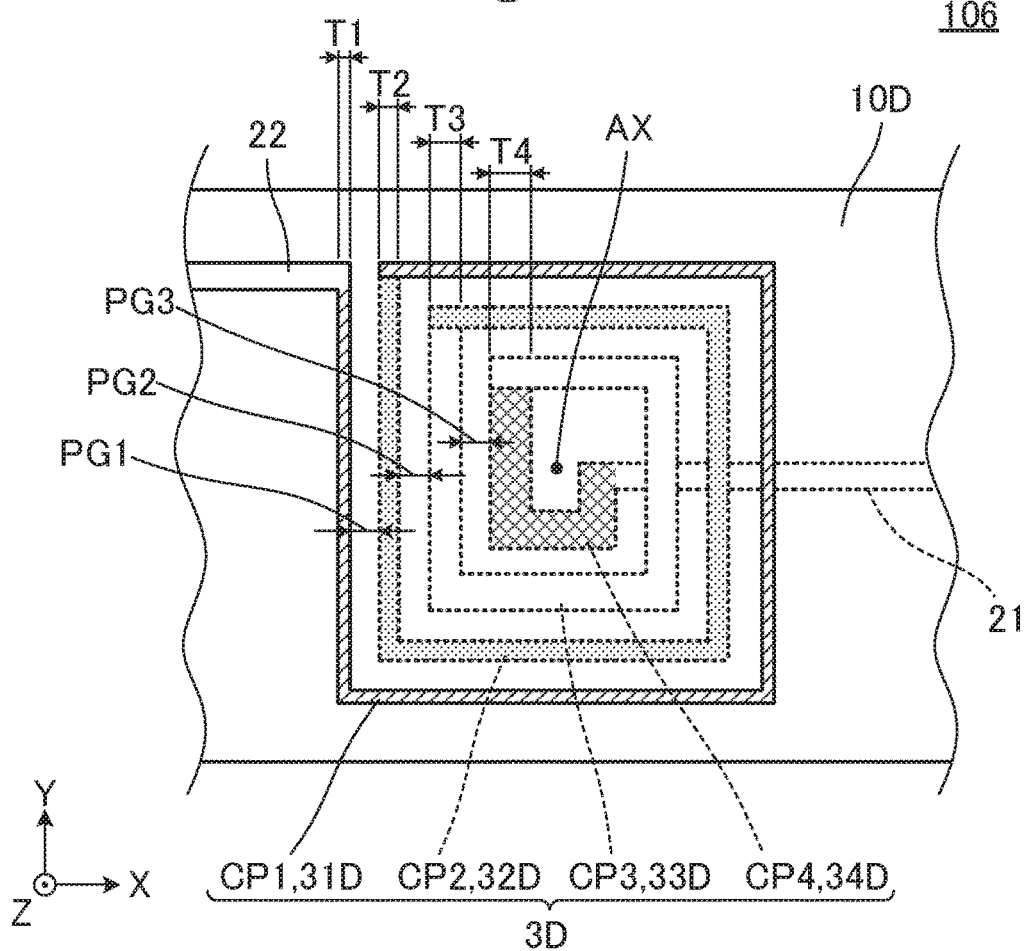
FIG. 15A is a plan view of a portion of an inductor bridge 106 according to a sixth preferred embodiment of the present invention, the portion including a conical coil 3D is provided.
Figure 15B:
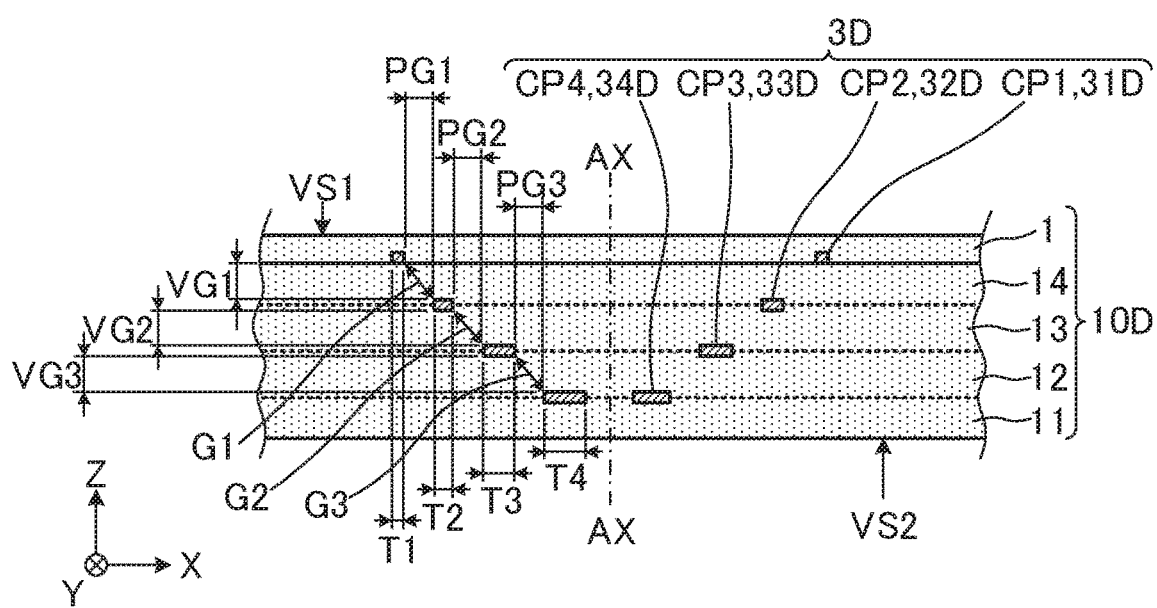
FIG. 15B is a sectional view of the portion.

FIG. 15A is a plan view of a portion of an inductor bridge 106 according to the sixth preferred embodiment, the portion including a conical coil 3D is provided, and FIG. 15B is a sectional view of the portion. In FIG. 15A, for ease of understanding the structure, a first coil portion CP1 is shown by hatching, a second coil portion CP2 is shown by a dot pattern, and a fourth coil portion CP4 is shown by cross-hatching.

The inductor bridge 106 includes an insulating base material 10D, a conical coil 3D (described below in detail) in contact with the insulating base material 10D, and other elements. The basic structure of the insulating base material 10D is the same or substantially the same as that of the insulating base material 10B according to the fourth preferred embodiment.

The conical coil 3D according to the present preferred embodiment includes a large-diameter loop shaped conductor 31D, a small-diameter loop shaped conductor 32D, a small-diameter loop shaped conductor 33D, a small-diameter loop shaped conductor 34D, and interlayer connection conductors (not shown). The conical coil 3D has a winding axis AX that is perpendicular or substantially perpendicular to a first main surface VS1 and a second main surface VS2 (parallel to the Z-axis direction).

The conical coil 3D preferably includes more than about 2 turns, for example, about 4.5 turns, and includes the first coil portion CP1, the second coil portion CP2, a third coil portion CP3, and the fourth coil portion CP4.

In the present preferred embodiment, as illustrated in FIG. 15A, the large-diameter loop shaped conductor 31D including about 1 turn, for example, which is provided on the front surface of a base material layer 14, corresponds to the first coil portion CP1; and the small-diameter loop shaped conductor 32D including about 1 turn, for example, which is provided on the front surface of a base material layer 13, corresponds to the second coil portion CP2. In the present preferred embodiment, the small-diameter loop shaped conductor 33D including about 1 turn, for example, which is provided on the front surface of a base material layer 12, corresponds to the third coil portion CP3; and the small-diameter loop shaped conductor 34D including about 0.5 turns, for example, which is provided on the front surface of a base material layer 11, corresponds to the fourth coil portion CP4.

As illustrated in FIGS. 15A and 15B, the line width T1 of the first coil portion CP1 is smaller than the line width of any of the other coil portions (the line width T2 of the second coil portion CP2, the line width T3 of the third coil portion CP3, and the line width T4 of the fourth coil portion CP4). The line width of the n-th coil portion is smaller than the line width of the (n+1)-th coil portion. To be specific, the line width T2 of the second coil portion CP2 is smaller than the line width T3 of the third coil portion CP3, and the line width T3 of the third coil portion CP3 is smaller than the line width T4 of the fourth coil portion CP4. The line width is smaller in this order of the first coil portion CP1, the second coil portion CP2, the third coil portion CP3, and the fourth coil portion CP4.

The conical coil 3D includes a first gap G1, a second gap G2, and a third gap G3. As illustrated in FIG. 15B, the first gap G1 is equal or substantially equal to the other gaps (the second gap G2 and the third gap G3).

In the present preferred embodiment, as illustrated in FIG. 15A, a first gap PG1 as viewed in the Z-axis direction is equal or substantially equal to the other gaps (a second gap PG2 and a third gap PG3) as viewed in the Z-axis direction. In the present preferred embodiment, as illustrated in FIG. 15B, a first gap VG1 in the Z-axis direction is equal or substantially equal to the other gaps (a second gap VG2 and a third gap VG3) in the Z-axis direction. Therefore, as described above, the first gap G1 is equal or substantially equal to the other gaps (the second gap G2 and the third gap G3).

The inductor bridge 106 according to the present preferred embodiment has the following advantageous effects, in addition to the advantageous effects described in the third preferred embodiment.

In the present preferred embodiment, the line width T1 of the first coil portion CP1 is smaller than the line width of any of the other coil portions (the line width T2 of the second coil portion CP2, the line width T3 of the third coil portion CP3, and the line width T4 of the fourth coil portion CP4). A portion at which the first coil portion CP1 and the second coil portion CP2 extend in parallel or substantially in parallel to each other is longer than a portion at which the other coil portions (the second coil portion CP2 and the third coil portion CP3, or the third coil portion CP3 and the fourth coil portion CP4) extend in parallel or substantially in parallel to each other. Therefore, with this structure, the area in which the first coil portion CP1 and the second coil portion CP2 face each other is reduced, and thus, compared with a case in which the line widths of the other coil portions are reduced (the area in which the other coil portions face each other is reduced), the interline capacitance of the conical coil 3D is able to be effectively reduced, and the self-resonance frequency of the conical coil 3D is able to be increased.

With the structure described above, the interline capacitance of the conical coil is able to be reduced without increasing the thickness of the conical coil in the Z-axis direction and the area of the conical coil as viewed in the Z-axis direction (the area of the conical coil on the XY plane).

With this structure, compared with a case in which the line widths of all of the coil portions (the first coil portion CP1, the second coil portion CP2, the third coil portion CP3, and the fourth coil portion CP4) are reduced, the interline capacitance of the conical coil 3D is able to be effectively reduced, while reducing the direct-current resistance.

In the present preferred embodiment, the line width T2 of the second coil portion CP2 is smaller than the line width T3 of the third coil portion CP3, and the line width T3 of the third coil portion CP3 is smaller than the line width T4 of the fourth coil portion CP4. That is, the line width of the n-th coil portion is smaller than the line width of the (n+1)-th coil portion. A portion at which the n-th coil portion and the (n+1)-th coil portion extend in parallel or substantially in parallel to each other is longer than a portion at which the (n+1)-th coil portion and the (n+2)-th coil portion extend in parallel or substantially in parallel to each other. Therefore, with this structure, compared with a case in which the line width of the (n+1)-th coil portion is reduced, the interline capacitance of the conical coil 3D is able to be effectively reduced, and the self-resonance frequency of the conical coil 3D is able to be increased. That is, by reducing the line width of a coil portion that is located further toward the outer periphery, the interline capacitance of the conical coil is able to be effectively reduced.

Seventh Preferred Embodiment

In a seventh preferred embodiment of the present invention, an example of a conical coil in which coil portions do not coincide with loop shaped conductors will be described.

Figure 16A:
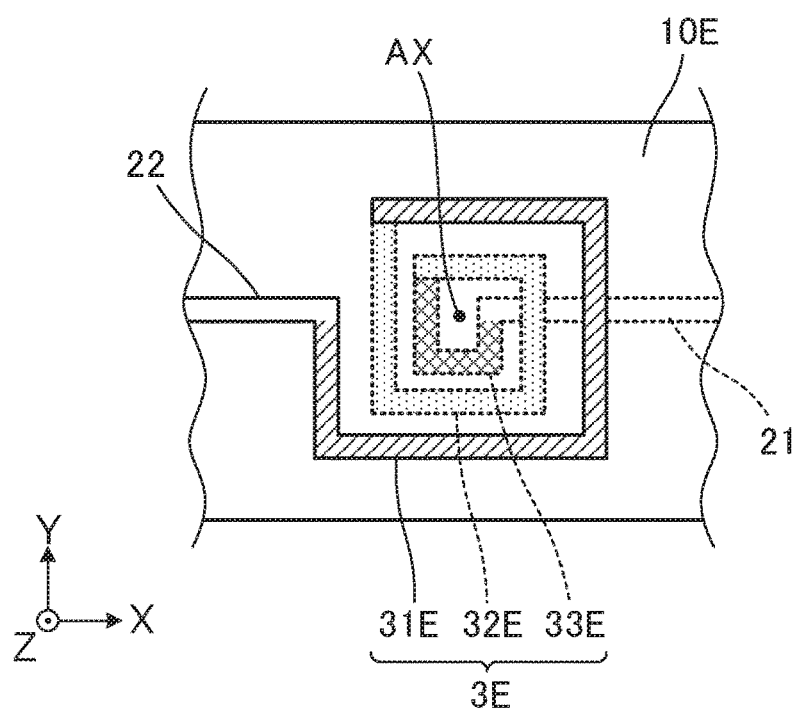
FIG. 16A is a plan view illustrating loop shaped conductors in a portion of an inductor bridge 107 according to a seventh preferred embodiment of the present invention, the portion including a conical coil 3E is provided.
Figure 16B:
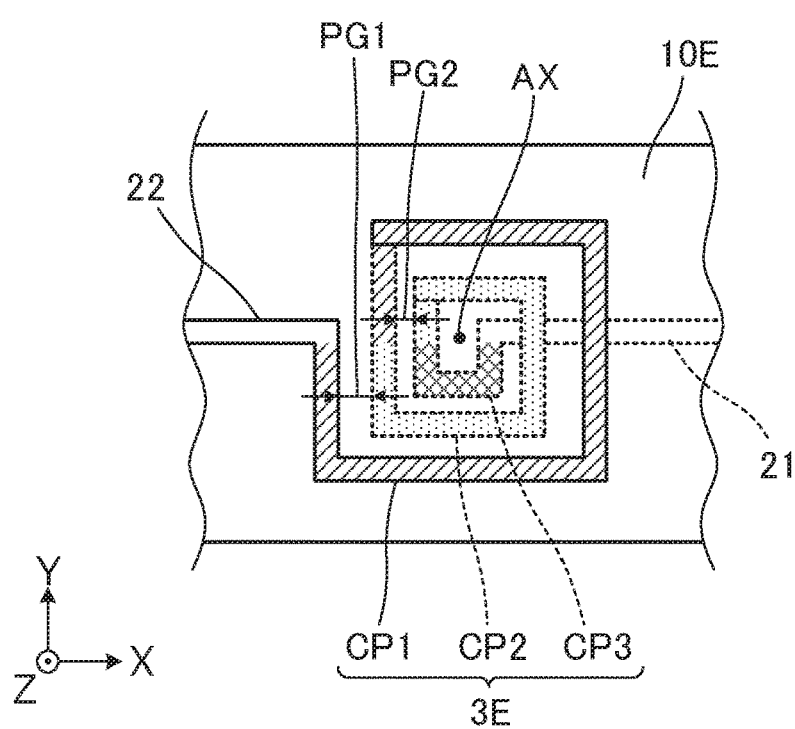
FIG. 16B is a plan view illustrating coil portions in the portion.
Figure 17:
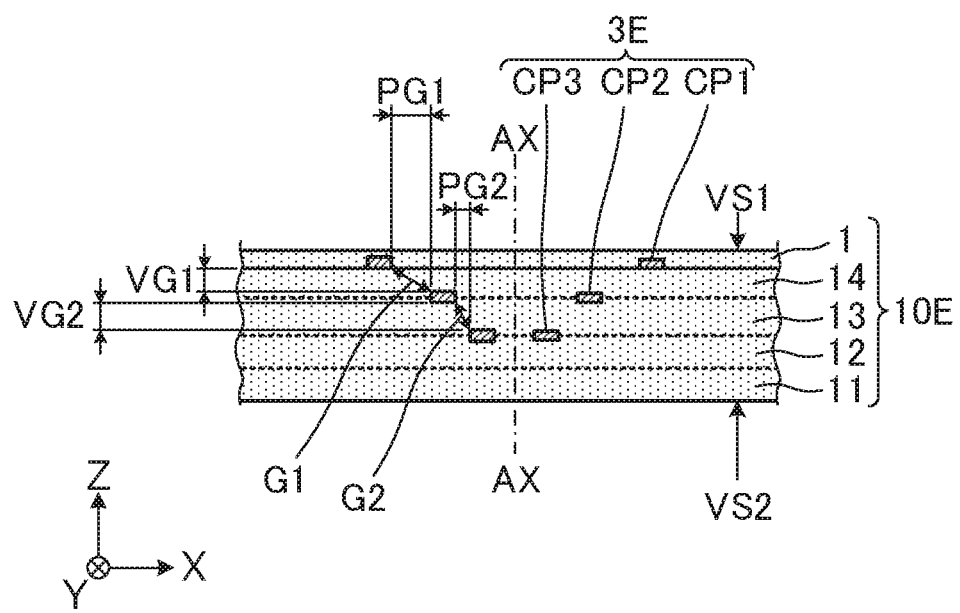
FIG. 17 is a sectional view of the portion of the inductor bridge 107 in which the conical coil 3E is provided.
Figure 18:
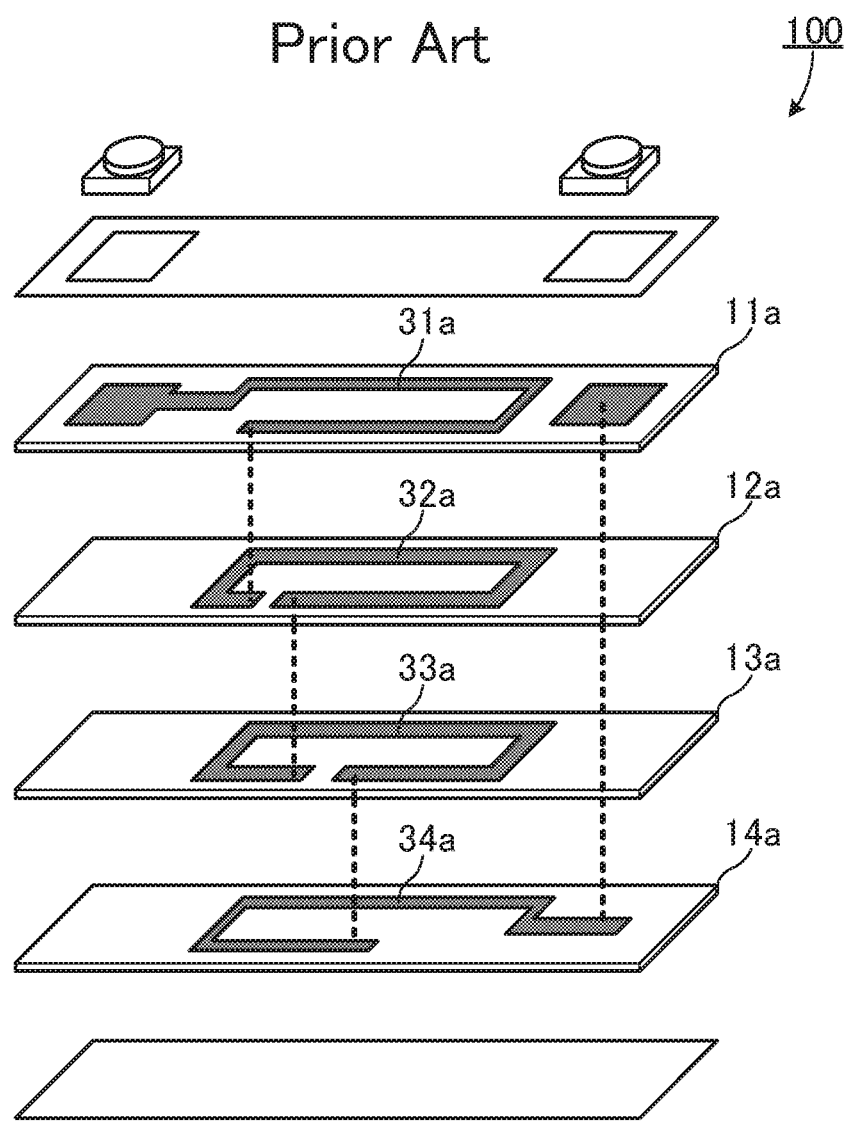
FIG. 18 is an exploded perspective view of an inductor bridge described in International Publication No. 2014/129279.

FIG. 16A is a plan view illustrating loop shaped conductors in a portion of an inductor bridge 107 according to the seventh preferred embodiment, the portion including a conical coil 3E is provided, and FIG. 16B is a plan view illustrating coil portions in the portion. FIG. 17 is a sectional view of the portion of the inductor bridge 107 in which the conical coil 3E is provided.

In FIG. 16A, for ease of understanding the structure, a large-diameter loop shaped conductor 31E is shown by hatching, and a small-diameter loop shaped conductor 32E is shown by a dot pattern. In FIG. 16B, a first coil portion CP1 is shown by hatching, a second coil portion CP2 is shown by a dot pattern, and a third coil portion CP3 is shown by cross-hatching.

The inductor bridge 107 includes an insulating base material 10E, a conical coil 3E (described below in detail) in contact with the insulating base material 10E, and other elements. The basic structure of the insulating base material 10E is the same or substantially the same as that of the insulating base material 10A according to the third preferred embodiment.

The conical coil 3E according to the present preferred embodiment includes the large-diameter loop shaped conductor 31E, the small-diameter loop shaped conductor 32E, a small-diameter loop shaped conductor 33E, and interlayer connection conductors (not shown). The basic structure of the conical coil 3E is the same or substantially the same as that of the conical coil 3A described in the third preferred embodiment.

Hereinafter, differences from the conical coil 3A according to the third preferred embodiment will be described.

The conical coil 3E preferably includes more than about 2 turns, for example, about 2.5 turns, and includes the first coil portion CP1, the second coil portion CP2, and the third coil portion CP3. In the present preferred embodiment, as illustrated in FIGS. 16A and 16B, the first coil portion CP1 includes the large-diameter loop shaped conductor 31E, which is provided on the front surface of the base material layer 14, and a portion of the small-diameter loop shaped conductor 32E, which is provided on the front surface of the base material layer 13. The second coil portion CP2 includes a portion of the small-diameter loop shaped conductor 32E, which is provided on the front surface of the base material layer 13, and a portion of the small-diameter loop shaped conductor 33E, which is provided on the front surface of the base material layer 12. The third coil portion CP3 includes a portion of the small-diameter loop shaped conductor 33E.

As illustrated in FIG. 17, the conical coil 3E includes a first gap G1 and a second gap G2. The first gap G1 is larger than the other gap (the second gap G2).

Such a structure also has advantageous effects that are the same or substantially the same as those of the inductor bridges 104 and 105 according to the fourth and fifth preferred embodiments.

In each of the preferred embodiments described above, an example in which the planar shape of the insulating base material is rectangular or substantially rectangular has been described. However, this structure is not a limitation. The planar shape of the insulating base material may be appropriately changed as long as the advantageous effects of the present invention are able to be obtained. For example, the planar shape may be a polygon, a circle, an ellipse, an L-shape, a crank shape, a T-shape, a Y-shape, or other suitable shapes.

In each of the preferred embodiments described above, an inductor bridge including an insulating base material including four base material layers that are stacked has been described. However, this structure is not a limitation. The number of base material layers of the insulating base material may be appropriately changed as long as the advantageous effects of the present invention are able to be obtained. For example, the base material layer may be a single layer.

In each of the preferred embodiments described above, an example in which a conical coil including about 1.5 turns, about 2.5 turns, or about 4.5 turns, including loop shaped conductors provided on a plurality of base material layers, has been described. However, this structure is not a limitation. The number of turns of a conical coil included in an inductor bridge may be appropriately changed. The outer shape of a conical coil as viewed in the winding axis direction (Z-axis direction) may be, for example, a circle, an ellipse, a rectangle, or a polygon. Moreover, in each of the preferred embodiments described above, an example of a conical coil including a small-diameter loop shaped conductor including less than about 1 turn and a large-diameter loop shaped conductor has been described. However, a conical coil may include a spiral small-diameter loop shaped conductor including about 1 turn or more and a large-diameter loop shaped conductor.

In each of the preferred embodiments described above, an example in which one connector is disposed on each of a first main surface and a second main surface of the insulating base material has been described. However, this structure is not a limitation. Two connectors may be disposed only on the first main surface of the insulating base material or only on the second main surface of the insulating base material. The dispositions and the number of the connectors may be appropriately changed in accordance with the circuit structure of the inductor bridge.

In preferred embodiments of the present invention, connectors may be omitted. Connection portions may be connected to the first circuit, the second circuit, and other suitable structure by using an electroconductive joining material, such as solder, for example, without using the connectors.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic device comprising:
an inductor bridge;
a first circuit; and
a second circuit; wherein
the first circuit and the second circuit are connected to each other via the inductor bridge;
the inductor bridge includes:
an insulating base material including a first main surface and that has flexibility; and
a conical coil in contact with the insulating base material and including a winding axis perpendicular or substantially perpendicular to the first main surface;
the conical coil includes a plurality of loop shaped conductors arranged in a winding axis direction of the conical coil;
inner and outer diameters of the plurality of loop shaped conductors change in one way in the winding axis direction;
the plurality of loop shaped conductors do not overlap each other as viewed in the winding axis direction; and
a large-diameter loop shaped conductor, which is one of the plurality of loop shaped conductors that has largest inner and outer diameters, is disposed such that the inner and outer diameters thereof relatively extend along the insulating base material compared with remaining loop shaped conductors of the plurality of loop shaped conductors when the inductor bridge is bent.

2. The electronic device according to claim 1, wherein the insulating base material is a multilayer body including a plurality of base material layers made of a thermoplastic resin that are stacked.

3. The electronic device according to claim 1, wherein the inductor bridge includes a bent portion.

4. The electronic device according to claim 3, wherein the inductor bridge includes another bent portion; and the conical coil is disposed between the bent portion and the another bent portion.

5. The electronic device according to claim 3, wherein the large-diameter loop shaped conductor is located closer to the first main surface than to the second main surface; and
when the inductor bridge is bent, a tensile stress is applied to the first main surface, and a compressive stress is to the second main surface.

6. The electronic device according to claim 1, wherein the conical coil includes more than about 2 turns; as viewed in the winding axis direction, when a portion of the conical coil that is wound at an outermost periphery is defined as a first coil portion, a portion of the conical coil that is located at an (n−1)-th from the first coil portion to an inner periphery is defined as an n-th coil portion, n being an integer larger than or equal to 2;
a gap between the first coil portion and a second coil portion is defined as a first gap, and a gap between the n-th coil portion and an (n+1)-th coil portion is defined as an n-th gap;
the first gap is larger than any other gaps.

7. The electronic device according to claim 6, wherein the n-th gap is larger than an (n+1)-th gap.

8. The electronic device according to claim 6, wherein the first gap as viewed in the winding axis direction is larger than any of the other gaps as viewed in the winding axis direction.

9. The electronic device according to claim 8, wherein the n-th gap as viewed in the winding axis direction is larger than an (n+1)-th gap as viewed in the winding axis direction.

10. The electronic device according to claim 6, wherein the first gap in the winding axis direction is larger than any of the other gaps in the winding axis direction.

11. The electronic device according to claim 10, wherein the n-th gap in the winding axis direction is larger than an (n+1)-th gap in the winding axis direction.

12. The electronic device according to claim 6, wherein a line width of the first coil portion is smaller than a line width of any of the other coil portions.

13. The electronic device according to claim 12, wherein a line width of the n-th coil portion is smaller than a line width of the (n+1)-th coil portion.

14. The electronic device according to claim 6, wherein the conical coil includes about 4.5 turns.

15. The electronic device according to claim 1, wherein the insulating base material includes a protective layer provided adjacent to the first main surface of the insulating base material.

16. The electronic device according to claim 15, wherein the protective layer is a solder resist film.

17. The electronic device according to claim 1, wherein the large-diameter loop shaped conductor is a rectangular or substantially rectangular loop shaped conductor pattern preferably including about 0.8 turns.

18. The electronic device according to claim 1, wherein the plurality of loop shaped conductors includes four loop shaped conductors.

19. The electronic device according to claim 1, wherein the inductor bridge includes a first connector connected to the first circuit and a second connector connected to the second circuit.

20. The electronic device according to claim 1, wherein
the first circuit includes a first receptacle;
the second circuit includes a second receptacle;
the first connector is connected to the first receptacle; and
the second connector is connected to the second receptacle.

* * * * *